United States Patent [19]
Sato et al.

[11] Patent Number: 5,812,407
[45] Date of Patent: Sep. 22, 1998

[54] APPARATUS FOR CORRECTING AND HOLDING FRONT SURFACE OF SHEET

[75] Inventors: Shuzo Sato, Kanagawa; Hiizu Otorii; Nobuo Suematsu, both of Tokyo, all of Japan

[73] Assignee: Sony Corporation, Tokyo, Japan

[21] Appl. No.: 909,818

[22] Filed: Aug. 12, 1997

[30] Foreign Application Priority Data

Aug. 13, 1996 [JP] Japan ...................................... 8-213673
May 27, 1997 [JP] Japan ...................................... 9-136775

[51] Int. Cl.$^6$ ...................................................... G06F 15/46
[52] U.S. Cl. ............................... 364/474.35; 364/167.01; 364/599; 33/533; 414/836
[58] Field of Search ............................... 73/159; 33/1 M, 33/533; 271/228, 236; 414/935, 936; 364/474.34, 474.35, 167.01

[56] References Cited

U.S. PATENT DOCUMENTS

| | | | |
|---|---|---|---|
| 4,328,553 | 5/1982 | Fredriksen et al. | 364/559 |
| 4,934,064 | 6/1990 | Yamaguchi et al. | 33/645 |
| 5,253,429 | 10/1993 | Konno et al. | 33/568 |
| 5,365,672 | 11/1994 | Kato | 33/1 M |
| 5,528,487 | 6/1996 | Adachi et al. | 364/167.01 |
| 5,566,076 | 10/1996 | Kuroda | 364/478.01 |
| 5,636,960 | 6/1997 | Hiroki et al. | 414/331 |
| 5,673,208 | 9/1997 | Meier et al. | 364/525 |
| 5,692,873 | 12/1997 | Weeks et al. | 414/627 |
| 5,721,607 | 2/1998 | Ota | 355/53 |

Primary Examiner—Ronald L. Biegel
Attorney, Agent, or Firm—Hill & Simpson

[57] ABSTRACT

An apparatus for correcting an orientation and a geometry of a front surface of a semiconductor wafer and holding the wafer in a state in which the adjusted surface state is kept. The apparatus has a chuck for holding a wafer; a surface measuring means for measuring a state of a front surface of the wafer; a surface adjusting means including a plurality of surface correcting portions vertically movable for partially deforming the holding portion, whereby the surface of the holding portion is deformed by independent actions of the surface correcting portions; and a tilting portion as an orientation adjusting means for adjusting a tilting angle of the front surface of the wafer with respect to the center axis thereof and an orientation of the tilting. The tilting angle of the front surface of the wafer with respect to the center axis thereof and the orientation of the tilting, and further the geometry of the front surface of the wafer are corrected by a manner of measuring them by the surface measuring means, and controlling them on the basis of the measured results by both the orientation adjusting means and the surface adjusting means.

6 Claims, 18 Drawing Sheets

FIG. IA
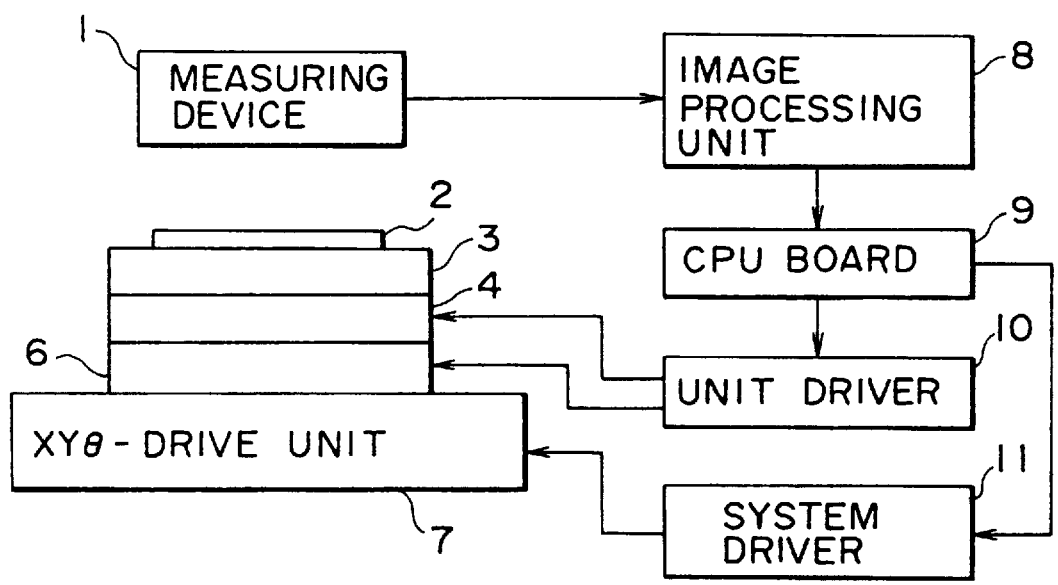
FIG. IB
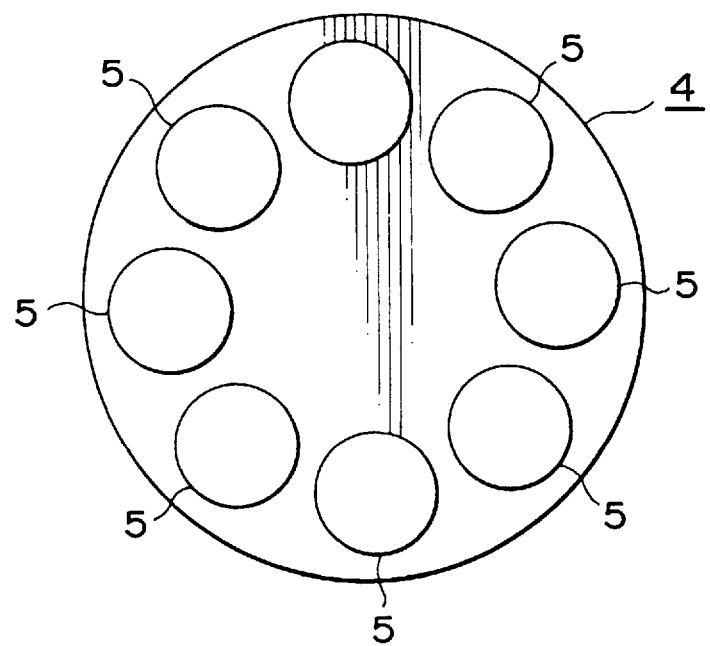

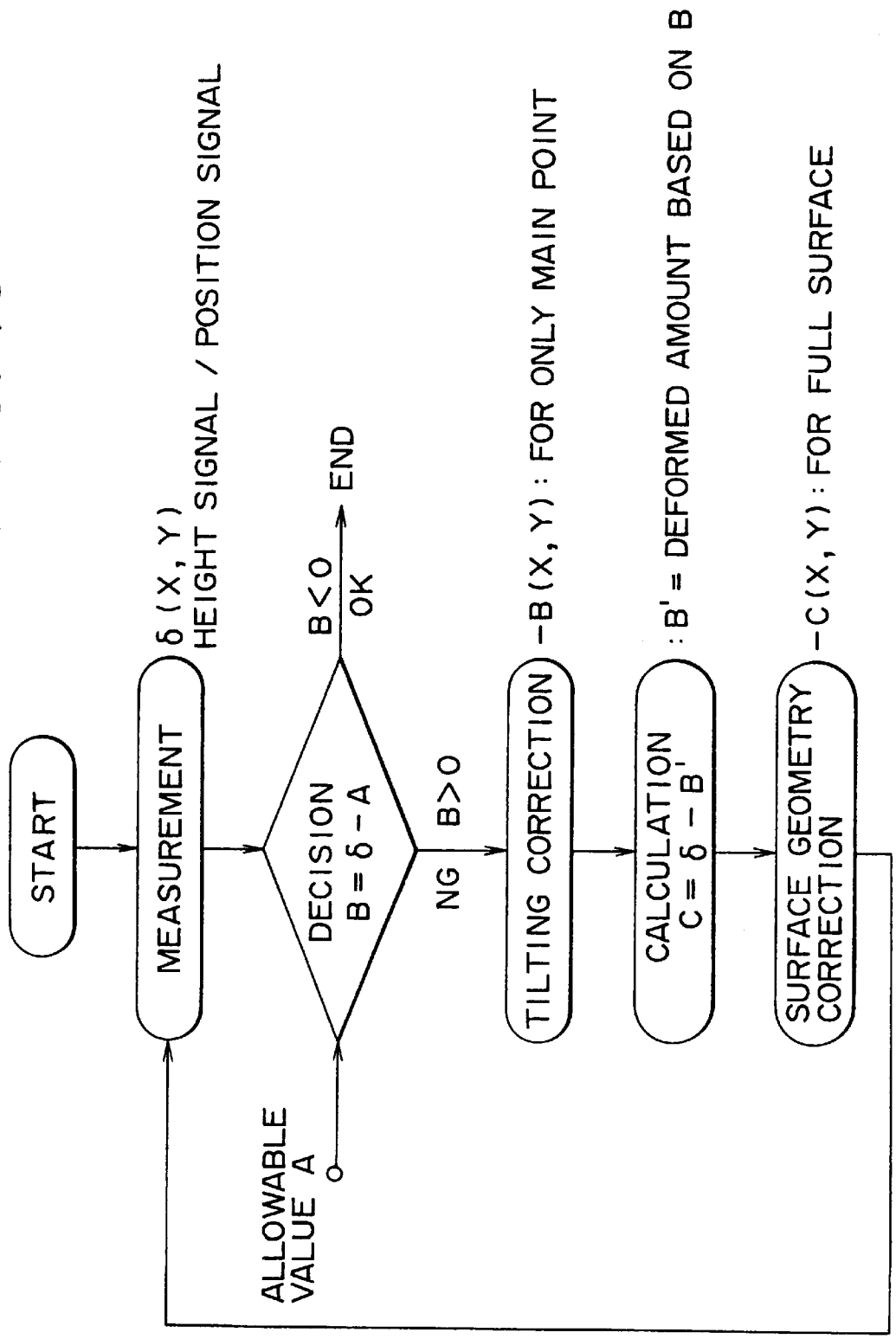

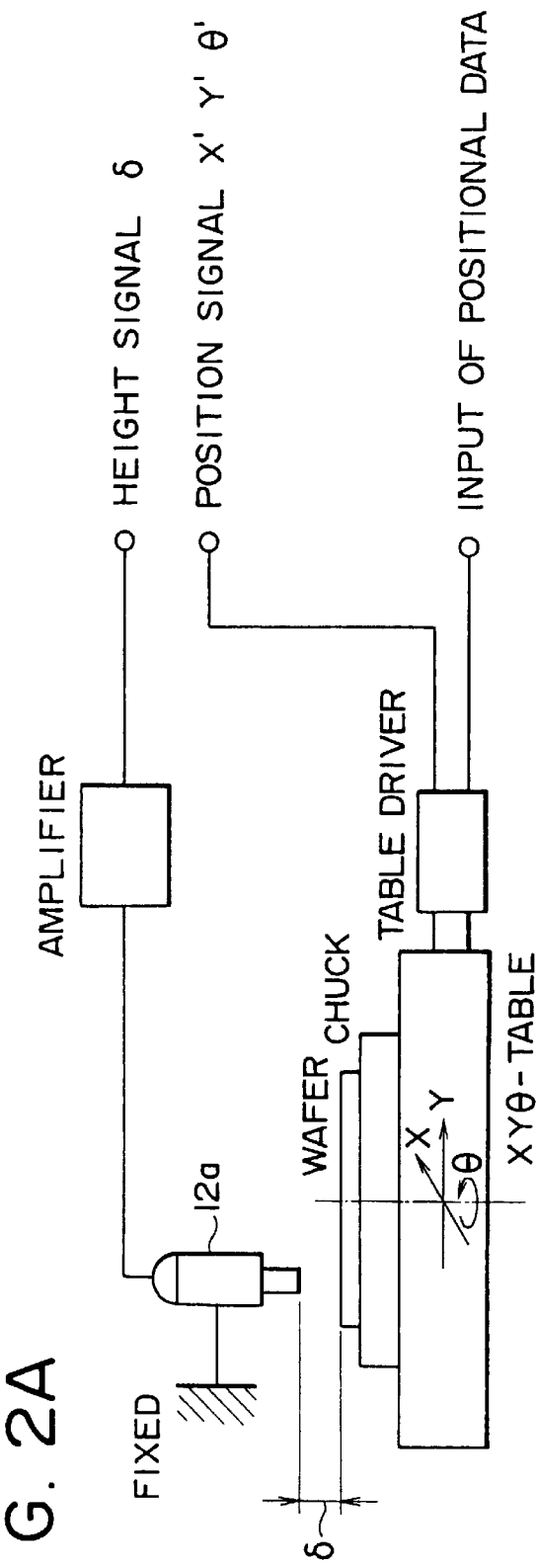
F I G. 2A
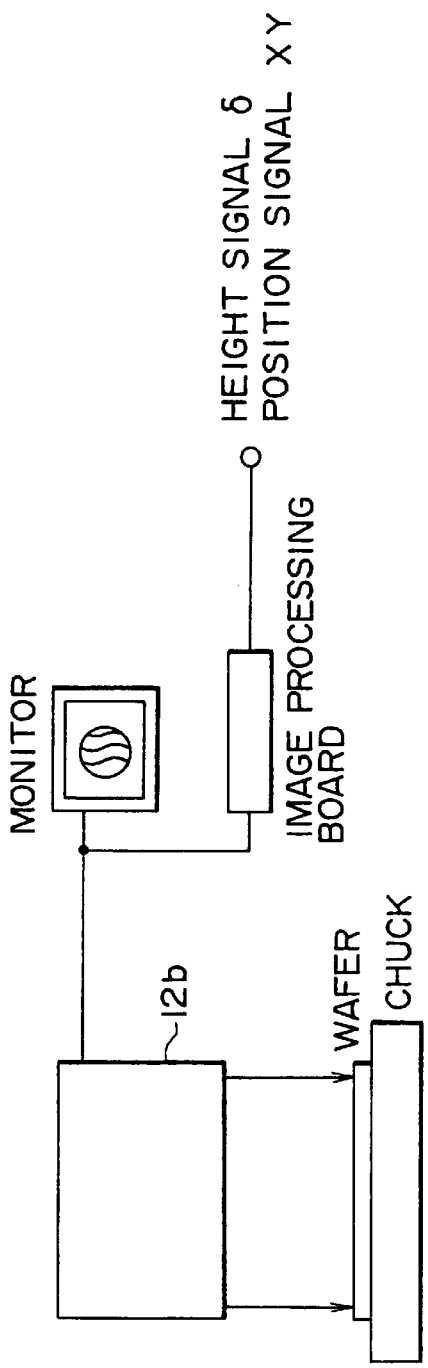
F I G. 2B

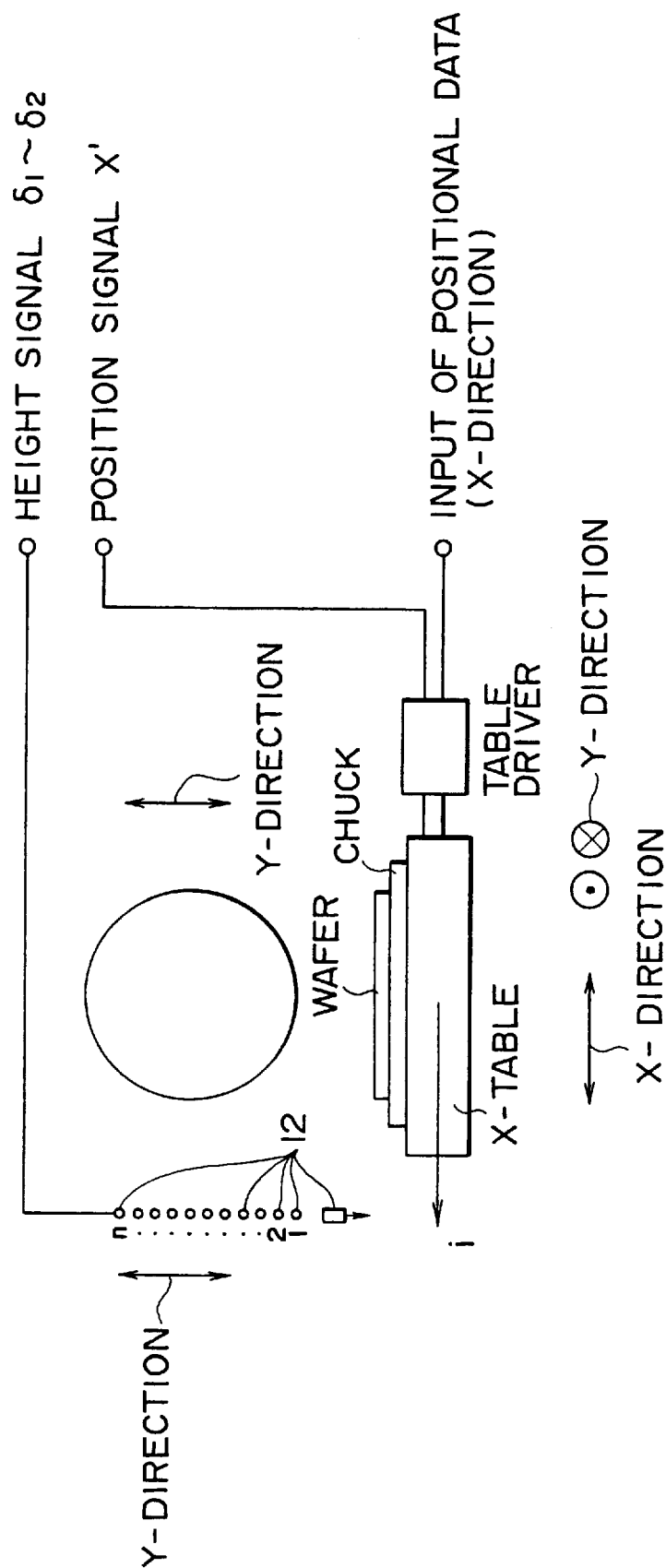

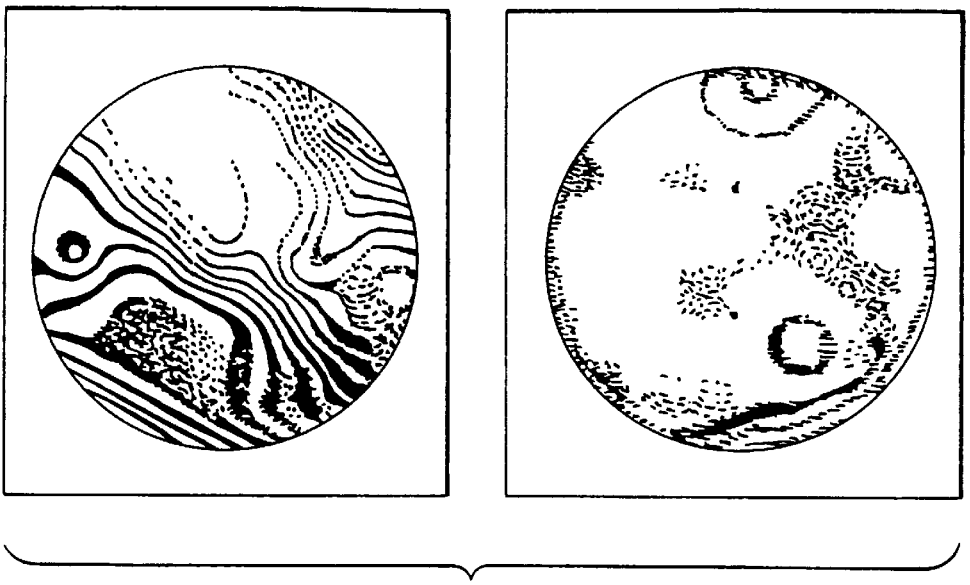
FIG. IIB
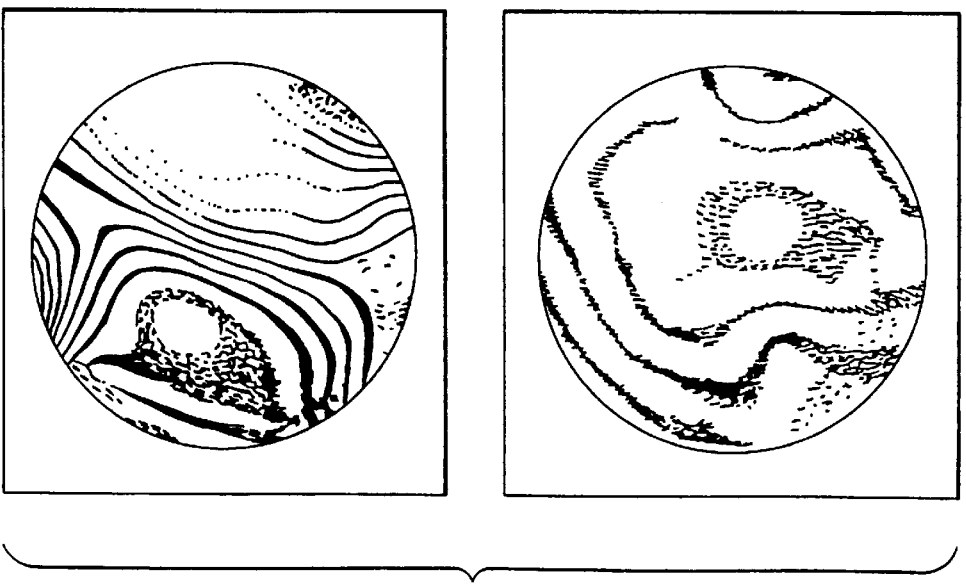
FIG. IIA

WEDGE

WEDGE

CONTOUR LINE

APPARATUS FOR CORRECTING AND HOLDING FRONT SURFACE OF SHEET

BACKGROUND OF THE INVENTION

The present invention relates to an apparatus for correcting and holding a front surface of a sheet, and particularly to an apparatus for correcting and holding both an orientation of a front surface of a sheet, typically a semiconductor wafer with respect to the center axis thereof and irregularities of the front surface of the sheet, using a surface adjusting means and an orientation adjusting means.

In semiconductor equipment, semiconductor wafers are often processed and/or machined in states being held by holding devices, for example, at steps using a stepper (stepping type reduction projection aligner) and a chemical-mechanical polishing machine.

In such semiconductor equipment, a semiconductor wafer has been processed and/or machined in a state being held on a back surface basis. Specifically, the surface of a surface table for holding a semiconductor wafer, which is taken as a reference plane, is accurately positioned, and a semiconductor wafer is held thereon. The wafer is then subjected to exposure, polishing, and the like, with the front surface of the semiconductor wafer being estimated to be positioned higher an average thickness thereof than the surface of the surface table, that is, the back surface of the semiconductor wafer.

The holding of semiconductor wafers on the back surface basis, however, makes it difficult to satisfy stronger demands toward enhancement in integration and performance or improvement in fabrication yield of semiconductor devices. The reason for this is that although it is required to make fine the design rule for satisfying high integration of devices and to make accurate the flatness of front surfaces of wafers for coping with multi-layered structure, semiconductor wafers available from wafer makers are not necessarily satisfactory in that thicknesses thereof are strictly varied, and front surfaces thereof are not flat but wavy and have partial irregularities. Further, the irregularities, etc. on the front surfaces of the wafers become larger as the device fabrication steps proceed. Consequently, according to a related art fabrication process in which a semiconductor wafer is held on the back surface basis, there is a limitation in improvement of process accuracy and fabrication yield.

FIGS. 18A to 18D show surface geometries of semiconductor wafers. In addition, an allowable variation in thickness of a 8 inch semiconductor wafer as being available is ±5 µm for the entire surface. In these figures, the irregularities in the lateral direction are quite emphasized for an easy understanding. FIG. 18A shows a surface geometry in which the front surface is tilted with respect to the bottom surface (back surface). Such a surface geometry is frequently observed in the state being available. FIG. 18B shows a surface geometry in which the front surface is cylindrically recessed. FIG. 18C shows a surface geometry in which the front surface spherically projects. Such a surface geometry is frequently observed as fabrication steps proceed. FIG. 18D shows a surface geometry in which the surface geometries shown in FIGS. 18A to 18C are mixed. In some cases, sizes of these surface irregularities reach values of several µm to ten and several µm.

According to the related art fabrication process, the above problem of the surface irregularities has been coped by performing focusing for each pattern at the exposure step using a stepper or adopting a special polishing pad and providing a dummy pattern at the polishing step using a chemical-mechanical polishing machine. However, the related art fabrication process has failed to perfectly solve the above problem.

SUMMARY OF THE INVENTION

The present inventor has conducted studies to solve the above problem of the related art fabrication process and found that the problem can be solved by holding a wafer with the front surface thereof being taken as a reference plane. Specifically, if a wafer is held in a state that the front surface thereof is taken as a reference plane and it is kept substantially perfectly flat, the wafer can be desirably subjected to exposure or polishing without performing focusing for each pattern at the exposure step using a stepper, or without forming a dummy pattern or adopting a special polishing pad at the polishing step using a polishing machine.

The present invention has been thus accomplished on the basis of the above knowledge.

Accordingly, an object of the present invention is to provide a new apparatus capable of correcting and holding both an orientation of a front surface of a sheet, typically a semiconductor wafer with respect to the center axis thereof and a partial irregularities of the front surface of the sheet, using a surface adjusting means and an orientation adjusting means.

To achieve the above object, according to the present invention, there is provided an apparatus for correcting and holding a state of a front surface of a sheet, including: a holding portion for holding a sheet; a surface measuring means for measuring a state of a front surface of the sheet held on the holding portion; a surface adjusting means positioned on the underside of the holding portion, the means comprising a plurality of surface correcting portions vertically movable for partially deforming the holding portion, whereby the geometry of the front surface of the sheet disposed on the surface of the holding portion is adjusted by deforming the surface of the holding portion and the sheet held on the surface of the holding portion through independent actions of the surface correcting portions; and an orientation adjusting means, positioned on the underside of the surface adjusting means, for adjusting a tilting of the front surface of the sheet with respect to the center axis thereof; wherein a state of the front surface of the sheet are corrected by measuring the tilting of the front surface of the sheet with respect to the center axis thereof and the geometry of the front surface of the sheet using the surface measuring means, and controlling both the orientation adjusting means and the surface adjusting means on the basis of the measured results.

With this configuration, a state of a front surface of a sheet can be desirably corrected by measuring both the tilting of the front surface of the sheet with respect to the center axis thereof and a geometry of the front surface of the sheet using the surface measuring means, and controlling the orientation adjusting means and the surface adjusting means on the basis of the measured results; and the sheet can be held in such a state. The sheet can be thus processed and/or machined in a state that it is held with the front surface (to be processed and/or machined) being taken as a reference plane. As a result, such a wafer can be processed and/or machined more preferably than a wafer processed and/or machined in accordance with the related art process, that is, in a state in which it is held with the back surface (not to be processed and/or machined) thereof being taken as a reference plane.

In the above apparatus, preferably, each of the plurality of surface correcting portions of the surface adjusting means includes: a slide member formed of a rigid body which is reciprocatingly movable in one direction and which has a tilting surface tilting in the direction; and a vertically movable member formed of a rigid body which is movable, by movement of the slide member, in the direction perpendicular to the movement direction of the slide member and which has a tilting surface slidable on the tilting surface of the slide member; whereby the geometry of the front surface of the sheet is corrected by deforming the surface of the holding portion and the sheet held on the surface of the holding portion through vertical movement of the vertically movable members of the plurality of surface correcting portions.

According to the surface adjusting means having the above configuration, the vertically movable member having the tilting surface slidable on the tilting surface of the slide member can be vertically moved by movement of the slide member. As a result, heights of portions of the surface holding portion can be adjusted by vertical movement of the vertically movable members of the surface correcting portions, and thereby the entire geometry of the front surface of the sheet can be corrected. Further, the slide member and the vertically movable member, each of which is formed of a block-like high rigidity member substantially regarded as a rigid body (hereinafter, referred to as a "rigid body"), are vertically deformed while keeping the contact state of the slide surfaces thereof. Consequently, the slide members and the vertically movable members can hold the sheet in a state being usually kept sufficiently rigid. The front surface of the sheet thus held by the slide members and the vertically movable members are prevented from being elasto-plastically deformed even when being applied with a processing pressure upon polishing or the like. It is to be noted that the term "rigidity" in the specification means that it has only an elasticity as small as being negligible with respect to the correction accuracy of the front surface of the sheet. This will be described later.

The surface adjusting means is preferably so configured that a tilting angle and a friction coefficient of each of the mutually slidable tilting surfaces of the slide member and the vertically movable member are specified at respective values allowing the slide member not to be slid by both the dead weight of the vertically movable member and an allowable load applied from top.

According to the surface adjusting means having the above configuration, the slide members are not moved even if a load is applied on the vertically movable members, and accordingly, after a state of the front surface of the sheet is adjusted by vertical movement of the vertically movable members through movement of the slide members, the adjusted surface state of the sheet can be kept unless an additional force is continuously applied to the surface adjusting means for forcibly keeping the adjusted surface state. That is, it is not necessary to provide any special means for forcibly keeping the adjusted surface state of the sheet. In summary, the surface state of the sheet having been adjusted once can be easily stably kept even when the vertically movable member is applied with a load.

The surface state of the sheet having been adjusted by the above surface adjusting means can be also kept even when a drive means (for example, a motor which will be described later) for moving the surface adjusting means is separated from the surface adjusting means.

Further, a plurality of the surface correcting portions constituting the surface adjusting means of the apparatus according to the present invention can be adjusted in accordance with various manners. For example, they can be adjusted one after another because the adjusted state of one surface correcting portion is not changed even at the time when the next one is adjusted. Of course, all of the surface correcting portions may be collectively adjusted at one time, so variousness of the adjusting way can be enhanced.

In the above surface adjusting means, a power source for reciprocatingly moving the slide member may be provided separately from the slide member.

According to the surface adjusting means having the above configuration, it is possible to prevent a phenomenon that heat generated from the power source from being transmitted to the slide member and also to the vertically movable member and thereby the adjusted state of the sheet is deviated by thermal deformation of the slide member and the vertically movable member.

For example, in the semiconductor fabrication technique requiring correction in the order of sub-micron, the surface height of the vertically movable member is changed to such an extent as not to be negligible even if the temperature of the member is changed only 1° C., although such a change in thickness is strictly dependent on the total thickness of the member. For this reason, the transmission of heat from the power source to the slide member and the vertically movable member is not negligible.

According to the present invention, however, since the power source is provided separately from the slide member, heat generated from the power source is hard to be transmitted to the slide member, so that it becomes possible to reduce the degree of deviation in the adjusted state of the sheet due to temperature change.

In the above surface adjusting means, preferably, the power source is composed of a motor; a thread hole is formed in the slide member; and a screw to be screwed with the thread hole is connected to a rotating shaft of the motor directly or through a clutch means.

According to the surface adjusting means having the above configuration, the slide member can be moved for adjustment of a surface state of the sheet by rotation of the motor. Further, by connecting the motor as the power source to the slide member through the clutch means, the motor is suitably connected to or separated from the slide member by the clutch means.

According to the apparatus of the present invention, the orientation adjusting means preferably includes a base member and a surface displacing member, which are two-divided parts formed by cutting a columnar or cylindrical body along a tilting plane, wherein an orientation of an opposed surface of the surface displacing member to the tilting surface thereof is changed by relatively rotating the base member and the surface displacing member.

According to the orientation adjusting means having the above configuration, a tilting angle of the opposed surface (orientation displacing surface) of the surface displacing member to the slidable tilting surface thereof is changed by relative rotation of the base member and the surface displacement member, and further, an orientation of the tilting is changed by integrally rotating the base member and the surface displacing member. As a result, the tilting angle and the orientation of the tilting of the orientation adjusting means can be easily adjusted.

Further, according to the orientation adjusting means, irrespective of the changed orientation of the tilting of the surface displacing member, there is not interposed an elastic body such as rubber and an elasto-plastic body such as urethane (hereinafter, referred to as a "elasto-plastic body"), that is, there is interposed only a rigid body between the orientation displacing surface of the surface displacing member and the opposed surface of the base member to the tilting surface thereof. As a result, the sheet can be usually held with a sufficient rigidity, and thereby it can be polished without occurrence of elasto-plastic deformation of the sheet due to a processing pressure upon polishing or the like.

BRIEF DESCRIPTION OF THE DRAWINGS

FIGS. 1A to 1C show a first embodiment of an apparatus for correcting and holding a state of a front surface of a sheet according to the present invention, wherein FIG. 1A is a schematic view showing a configuration of the apparatus; FIG. 1B is a schematic plan view of a surface adjusting means; and FIG. 1C is a flow chart schematically showing operational steps of the apparatus;

FIGS. 2A, 2B are schematic views each showing an example of a measuring device shown in FIG. 1A;

FIGS. 3A, 3B are schematic views each illustrating a multi-stage measurement method of simultaneously measuring a plurality of points for shortening a cycle time using a number of probes;

FIGS. 4A, 4B are views illustrating a principle of an example of a surface correcting portion constituting the surface adjusting means, wherein FIG. 4A is a perspective view of the example; and FIG. 4B is a schematic view illustrating relative movement of a vertically movable member with respect to a slide member;

FIGS. 5A, 5B are views showing a concrete example of the surface adjusting means shown in FIGS. 4A, 4B, wherein FIG. 5A is a plan view of the example; and FIG. 5B is a sectional view taken on line B—B of FIG. 5A;

FIGS. 6A, 6B, 6C each show a tilting portion as an orientation adjusting means in which the plan view and the cross-section of the tilting portion are shown on the upper and lower half sides respectively, wherein FIG. 6A shows a case that the tilting is zero; FIG. 6B shows a case that only a surface displacing member is 180° turned; and FIG. 6C shows a case that only a base member is 180° turned;

FIGS. 11A, 11B are diagrams each comparatively illustrating pictures transcribed from images obtained by measuring a state of a front surface of a 8-inch semiconductor wafer before and after correction using a laser interferometer (pictures before and after correction are shown on the upper and lower half sides respectively), wherein FIG. 11A shows the pictures in the field of 60 mm in diameter at a position of Y=50 mm, and FIG. 11B shows the pictures in the field of 60 mm in diameter at the wafer center;

FIGS. 12A, 12B, 12C are views illustrating a modification of the surface adjusting means of the embodiment shown in FIGS. 1A to 11B, wherein FIG. 12A is a plan view of the surface adjusting means; FIG. 12B is a sectional view taken on line B—B of FIG. 12A; and FIG. 12C is a view illustrating one example of a power transmission means from a power source to a slide member;

FIGS. 13A, 13B are views illustrating a concrete design example of a surface correcting portion of the surface adjusting means shown in FIGS. 12A to 12C, wherein FIG. 13A is a typical perspective view of a slide member and a vertically movable member; and FIG. 13B is a sectional view of the slider member, the vertically movable member, and a chuck;

DETAILED DESCRIPTION OF THE PREFERRED EMBODIMENTS

Figure 3B:
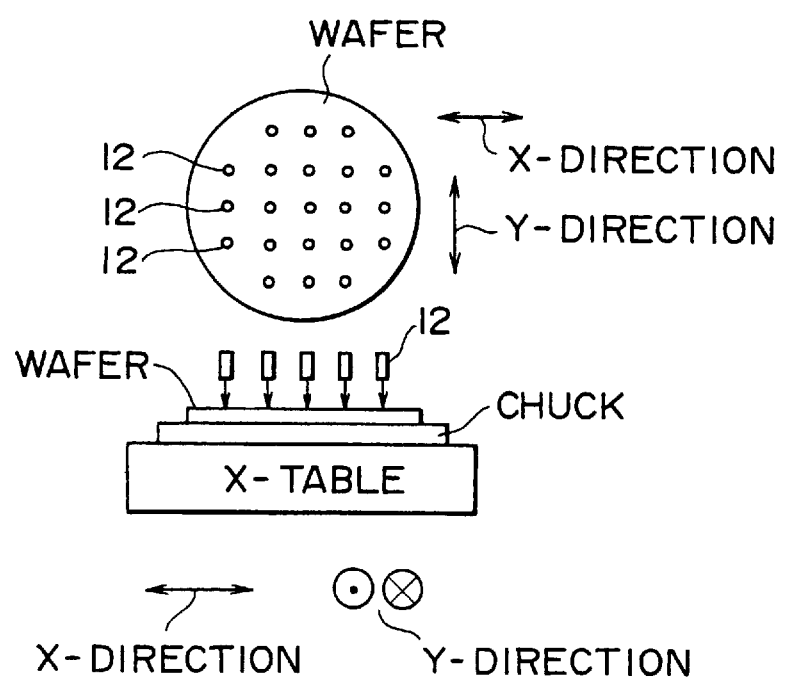

Prior to description of the preferred embodiments, there will be described the function of the present invention.

An apparatus for correcting and holding a state of a front surface of a sheet according to the present invention includes a holding portion for holding a sheet; a surface measuring means for measuring a state of the front surface of the sheet held on the holding portion; a surface adjusting means; and an orientation adjusting means for adjusting a tilting of the front surface of the sheet with respect to the center axis thereof. The surface adjusting means further includes a plurality of surface correcting portions vertically movable for partially deforming the holding portion. The geometry of the front surface of the sheet disposed on the surface of the holding portion is adjusted by deforming the surface of the holding portion and the sheet held on the surface of the holding portion through independent actions of the surface correcting portions. Thus, the state of the front surface of the sheet are corrected by measuring the tilting of the front surface of the sheet with respect to the center axis thereof and the geometry of the front surface of the sheet using the surface measuring means, and controlling both the orientation adjusting means and the surface adjusting means on the basis of the measured results.

As the sheet to be held with the front surface being corrected by the apparatus of the present invention, there can be used a silicon semiconductor wafer, a compound semiconductor wafer, an SOI wafer, and a substrate for a liquid crystal display. Of course, these are for illustrative purpose only, and it is to be understood that the present invention is applied to any member insofar as it is required to be held with the front surfaces being corrected. For example, when the surface state of a wafer or the like is measured or observed using AFM, STM, SEM or the like, there arises a large problem in deviation of focus. In such a case, the apparatus of the present invention is particularly effective because the deviation of focus can be made smaller by correcting the surface state of the wafer at a high accuracy. The surface measuring means is not particularly limited insofar as it can measure a surface state of a front surface of a sheet held on the holding portion. Of course, it may be of a non-contact type such as a capacitance type displacement meter or an auto-focus type laser displacement meter, or of a contact type. Each surface correcting portion constituting the surface adjusting means may be of any type insofar as it is vertically movable for partially deforming the holding portion for holding a sheet.

In the apparatus of the present invention, each of a plurality of the surface correcting portions of the surface adjusting means includes a slide member formed of a rigid body having a tilting surface; and a vertically movable member formed of a rigid body having a tilting surface slidable on the tilting surface of the slide member and being movable, by movement of the slide member, in the direction perpendicular to the movement direction of the slide member. Thus, the geometry of the front surface of the sheet is corrected by deforming the surface of the holding portion and the sheet held on the surface of the holding portion through vertical movement of the vertically movable members of the plurality of surface correcting portions.

Here, each of the slide member and the vertically movable member and also the holding portion is required to be formed of a rigid body. In this specification, the term "rigid body" means that it is elastically deformed to such a small extent as to be negligible with respect to the correcting accuracy of the surface state of a sheet. Any body, even if it has a significantly high rigidity, is necessarily elastically deformed when it is applied with a load. In this regard, there does strictly not exist a perfectly rigid body; however, in the case where a surface state of a sheet is corrected at an accuracy in the order of sub-micron, if an elastically deformed amount of a member (slide member, vertically movable member, or the like) causes only an error significantly smaller than the correction accuracy, the elastic deformation can be substantially negligible, and consequently, such a member may be regarded as a rigid body.

Accordingly, in the case where the accuracy in correction of a surface state of a sheet is relatively low, or in the case where the hardness of the sheet is low, a metal member made from iron or the like may be regarded as a rigid body and it can be used for the slide member or the like. However, in the case where the surface state of a semiconductor wafer is corrected at an accuracy in the order of sub-micron, a member made from iron or the like is no longer regarded as a rigid body, and a member made from a material having a smaller elasticity such as ceramic must be used.

In the apparatus of the present invention, a tilting angle and a friction coefficient of each of the mutually slidable tilting surfaces of the slide member and the vertically movable member can be specified at respective values allowing the slide member not to be slid by both the dead weight of the vertically movable member and an allowable load applied from top. With this configuration, the slide members are not moved even if a load is applied on the vertically movable members, and accordingly, after a state of the front surface of the sheet is adjusted by vertical movement of the vertically movable members through movement of the slide members, the adjusted surface state of the sheet can be kept unless an additional force is continuously applied to the surface adjusting means for forcibly keeping the adjusted surface state In the apparatus of the present invention, a power source for driving the slider member can be provided separately from the slide member. This is advantageous in that heat generated from the power source can be prevented from being transmitted to the slide member. In this case, a means for transmitting a power from the power source to the slide member is allowed to be interposed between the power source and the slide member. For example, in the case where a piezoelectric element is provided on the underside of the holding portion for performing surface correction, the holding portion is not separated from the piezoelectric element as a power source; while in the case where a motor as a power source is provided sideward (outward) of the slide member and a power of the motor is transmitted to the slide member through a suitable transmitting means, the slide member is substantially separated from the power source.

In the case where a motor is used as a power source, a thread hole may be provided in the slide member side and a screw to be screwed with the thread hole may be connected to a rotating shaft of the motor directly or indirectly through a clutch means or the like.

In the apparatus of the present invention, the orientation adjusting means includes a base member and a surface displacing member, which are two-divided parts formed by cutting an intermediate portion of a columnar or cylindrical rigid body along a plane tilting with respect to the center axis of the rigid body, the base member and the surface displacing member being slidably rotatably held in such a manner that the center axes thereof are not offset from each other at the cutting plane, wherein an orientation of the opposed surface of the surface displacing member to the cutting surface thereof is changed by rotating either or both of the base member and the surface displacing means. The rigid body in the orientation displacing means has the same meaning as that of the term "rigid body" previously described with respect to the slide member and the vertically movable member of the surface adjusting means.

Hereinafter, preferred embodiment of the present invention will be described in detail with reference to the accompanying drawings. FIGS. 1A, 1B, 1C show a first embodiment of an apparatus for correcting and holding a state of a front surface of a sheet according to the present invention, wherein FIG. 1A is a schematic view showing a configuration of the apparatus; FIG. 1B is a schematic plan view of a surface adjusting means; and FIG. 1C is a flow chart schematically showing operational steps of the apparatus.

In these figures, reference numeral 1 indicates a measuring device as the surface measuring means; 2 is a sheet, typically a semiconductor wafer; and 3 is a holding portion, typically a chuck. The measuring device 1 measures heights at specific coordinate points on a front surface of the wafer 2 held by the chuck 3. Here, the chuck 3 is formed from a rigid material (typically ceramic material such as alumina) into a thickness of about 20 mm to 30 mm, and it holds the wafer 2 using a retainer in combination with vacuum-attraction. It is important that the chuck 3 formed from a high rigidity material such as a ceramic material has a thickness being as large as about 20–30 mm. The reason for this is that the chuck 3 having a thickness smaller than the value will be excessively locally deformed, with a result that it becomes impossible to adjust extremely fine changes in height, for example, an irregularity having an extremely smooth gradient of the order of 1 μm or 0.1 μm per length of 100 mm.

Reference numeral 4 indicates a surface adjusting means 4, positioned on the underside of the chuck 3, for adjusting a surface state of the wafer 2 held by the chuck 3 by suitably deforming the chuck 3. The surface adjusting means 4 is composed of a plurality of surface correcting portions 5 independently movable in the vertical direction for partially deforming the chuck 3. It is to be noted that, although eight pieces of the surface correcting portions 5 are shown in this embodiment, the present invention is not particularly limited in terms of the number thereof. For example, there may be proposed a modification having 13 pieces of the surface correcting portions 5 wherein one piece is provided at the center; six pieces are positioned along a first circumference around the center; and six pieces are positioned along a second circumference concentric to and larger than the first circumference.

Reference numeral 6 indicates a tilting portion as an orientation adjusting means, positioned on the underside of the surface adjusting means 4, for tilting the front surface of the wafer 2 with respect to the center axis thereof a suitable angle in a suitable direction through the surface adjusting means 4 and the chuck 3. When the front surface of the wafer 2 is entirely tilted with respect to a reference plane (target plane, typically horizontal plane), the tilting of the front surface is adjusted by the tilting portion 6.

Reference numeral 7 indicates an XYθ-drive unit 7, positioned on the underside of the tilting portion 6, for entirely driving the tilting portion 6, surface adjusting means 4, chuck 3, and wafer 2 in the X-direction (horizontal direction), Y-direction (vertical direction) and θ-direction (rotating direction). The wafer 2 is suitably aligned for exposure or the like and suitably rotated and moved for polishing by the XYθ-drive unit 7.

Reference numeral 8 indicates an image processing unit for processing an output of the measuring device 1, more concretely, converting a signal relating to an irregular geometry of the front surface of the wafer 2 measured by the measuring device 1 into a signal indicating a height on each sampling coordinates (X, Y). Reference numeral 9 indicates a CPU board for processing a signal supplied from the image processing unit 8 and calculating each correction amount, and then supplying the calculated result to a unit driver 10 while supplying a drive signal (indicating a drive amount in the X-direction, Y-direction and θ-direction) to a system driver 11. The unit driver 10 drives each of the surface correcting portions 5 of the surface adjusting means 4 on the basis of a signal (indicating a correction amount of a surface geometry) supplied from the CPU board 9, and also drives the tilting portion 6 on a signal (indicating a correction amount of an orientation) supplied from the CPU board 9. The system driver 11 drives the XYθ-drive unit 7 on the basis of a drive signal supplied from the CPU board 9.

The operational steps of the apparatus of the present invention will be described with reference to FIG. 1C. A height difference δ (X, Y) between the front surface of the wafer 2 and a reference plane (target plane) at each of a plurality of predetermined sampling coordinates is measured. Then it is decided whether or not the measured result is within an allowable range A. More concretely, at this step, B=δ−A is calculated and it is decided whether B<0 or B>0. If B<0, it is determined that the surface state is good, and both the surface adjustment and the orientation adjustment are completed.

If B>0, the process goes on to the next step at which a tilting correction amount −B, required for angle adjustment (tilting correction) of the front surface of the wafer 2 with respect to the center axis thereof by the tilting portion 6, is calculated, and the tilting portion 6 is driven on the basis of the calculated value. In this case, the calculation may be performed not for all of the sampling coordinates but for only the predetermined main coordinates. This is because the correction amount can be obtained by giving only a tilting of the entire front surface of the wafer 2 with respect to the horizontal plane.

Subsequently, a corrected amount necessary for correcting the irregularities of the front surface of the wafer 2 is calculated. At this step, C=δ−B' is calculated for each sampling coordinates (B': deformed amount based on B), and on the basis of the calculated result, the correction amount of −C (X, Y) is given to the entire front surface of the wafer 2 by driving the surface correcting portions 5 of the surface adjusting means 4.

The process is then returned to the first step at which the surface state of the front surface of the wafer 2 is measured again. The above steps are thus repeated until it is decided that B<0.

In this way, the entire tilting of the front surface of the wafer 2 with respect to the target plane and also the irregularities of the front surface of the wafer 2 can be corrected.

In summary, according to the apparatus of the present invention, both the orientation and the geometry of the front surface of the wafer 2 are measured by the measuring device 1, and on the basis of the measured results, they can be desirably corrected by controlling the tilting portion 6 and the surface correcting portions 5 of the surface adjusting means 4, and further, the surface state of the wafer 2 thus adjusted can be held.

The wafer 2 thus corrected and held by the apparatus of the present invention can be subjected to machining (typically polishing), processing (typically coating of a resist film, and exposure) or inspection in a state that the front surface of the wafer 2 is held as a reference plane. As a result, such a wafer 2 can be machined or processed accurately as compared with a wafer machined or processed according to the related art manner, that is, in a state that it is held with the back surface (not machined or processed) being taken as a reference plane.

FIGS. 2A, 2B each show an example of the measuring device 1. In the example shown in FIG. 2A, a non-contact type displacement meter (typically capacitance type displacement meter) 12a is used as a probe of the measuring device 1. The probe 12a is fixed. Using the probe 12a thus fixed, heights δ (X, Y) at specific coordinates (X, Y) on the front surface of the wafer 2 can be measured by repeating the measurement while changing the position of the wafer 2 by a XYθ-table (equivalent to the XYθ-drive unit 7 in the apparatus shown in FIG. 1). Such a type is advantageous in enabling an inexpensive system configuration.

In the example shown in FIG. 2B, a laser interferometer 12b is used as a probe of the measuring device 1. Such a probe is advantageous in detecting nearly entire irregularities on the front surface of the wafer 2 for a short cycle time at a low cost. However, in some cases, measurement using the laser interferometer 12b becomes impossible depending on properties of the front surface of the wafer 2.

FIGS. 3A, 3B each show a multi-stage measurement example for shortening the cycle time, in which a number of probes (typically capacitance type displacement meters, auto-focus type laser displacement meters, contact type displacement meter, etc.) 12 are provided for simultaneously measuring a plurality of points on the front surface of the wafer 2 so as to shorten the cycle time. In each figure, the plan view and the side view of the measurement device are shown on the upper and lower half sides, respectively. In FIG. 3A, there is shown a case in which a plurality of probes are disposed in the Y-direction (from the front surface to the back surface of the paper in the lower side view), wherein the wafer 2 is moved by an X-table in the X-direction (right to left in the figure) for simultaneously measuring a plurality of points on the front surface of the wafer 2 along the Y-direction. In FIG. 3B, there is shown a case in which a plurality of probes are disposed two-dimensionally, that is, both in the X-direction and the Y-direction for simultaneously measuring a plurality of points on the front surface of the wafer 2 both in the X-direction and the Y-direction.

Figure 4A:
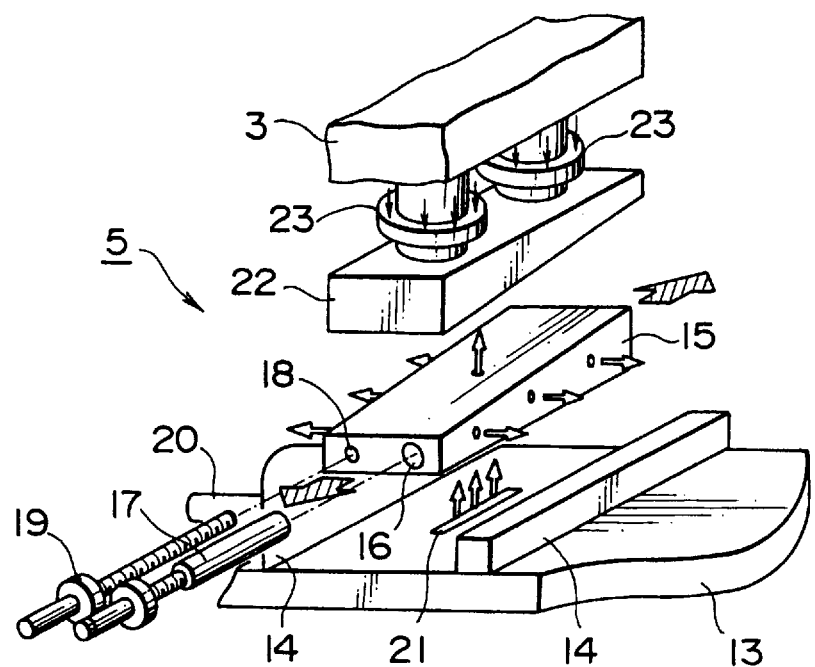
Figure 4B:
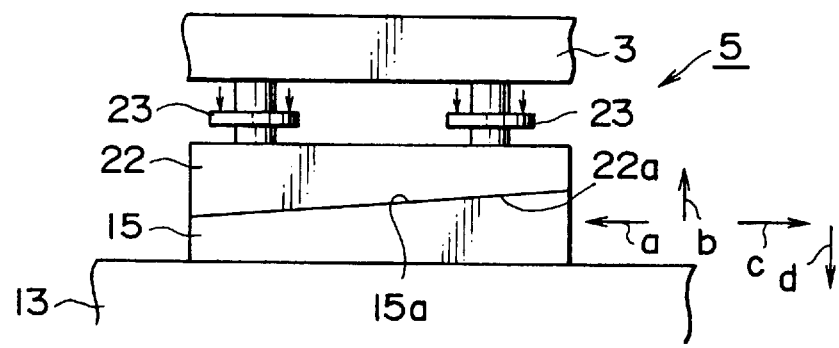

FIGS. 4A, 4B are views illustrating the principle of an example of the surface correcting portion 5 of the surface adjusting means 4, wherein FIG. 4A is an exploded view in perspective of the example; and FIG. 4B is a schematic view illustrating relative movement of a vertically movable member to a slide member. In these figures, reference numeral 13 indicates a stage of the surface correcting portion 5; 14, 14 are a pair of parallel rails; 15 is a slide member slidably provided on the stage 13 at a position between the rails 14, 14. The slide member 15 is formed of a rigid body, and has an upper surface 15a tilting along the movement direction. The tilting gradient of the upper surface 15a is typically $1/350$. Reference numeral 16 indicates a slidably guiding hole formed in the slide member 15 along the sliding direction of the slide member 15; 17 is a guide screwed with a self-lock bolt, which is slidably fitted in the slidably guiding hole 16 for guiding the slide member 15; 18 is a thread hole formed in the slide member 15 along the sliding direction of the slide member 15; and 19 is a positioning bolt screwed in the thread hole 18. The slide member 15 is positioned by rotation of the positioning bolt 19. For example, the slide member 15 is moved by rotation of the positioning bolt 19 at a rate of 0.05 $\mu$m per rotational angle of 18°, whereby the height of the vertically movable member can be changed.

Reference numeral 20 indicates an air supply unit for supplying air into an air passage provided in the stage 13. The air supplied by the air supply unit 20 is jetted from an air jetting hole 21 for moving the slide member 15 floatingly, that is, in a non-contact manner. This is effective to eliminate occurrence of error, stick-slip, etc. due to wear and friction. The slide member 15 has air passages for receiving part of the air jetted from the air jetting hole 21 and jetting it from the side and upper surfaces of the slide member 15. This is effective to avoid the contact of the slide member 15 with the rails 14 and also the contact with a vertically movable member 22 (which will be described later) when the slide member 15 is moved.

The vertically movable member 22 is formed of a rigid body and has a lower surface 22a tilting in the movement direction of the slide member 15. The tilting gradient of the lower surface 22a is the same as that of the upper surface 15a of the slide member 15. In the example shown in FIG. 4B, the tilting of the upper surface 15a of the slide member 15 becomes higher in the direction from left to right, while the tilting of the lower surface 22a of the vertically movable member 22 become higher in the direction from right to left.

The vertically movable member 22 is vertically movable; however, it is not movable along the horizontal plane (X-direction and the Y-direction). When the slide member 15 is moved by rotation of the screw 19 screwed with the thread hole 18, the vertically movable member 22 is correspondingly moved in the vertical direction. This mechanism will be described in detail with reference to FIG. 4B. It is to be noted that the thread hole 18, screw 19, guide 17, etc. are not shown in FIG. 4B for an easy understanding. When the slide member 15 is moved along the direction shown by an arrow "a" in FIG. 4B, the vertically movable member 22 is moved upward along the direction shown by an arrow "b". On the contrary, when the slide member 15 is moved along the direction shown by an arrow "c", the vertically movable member 22 is moved downward along the direction shown by an arrow "d".

Reference numeral 23 indicates a pre-load shaft for attracting the chuck 3 downward with the aid of a pre-load air having a pressure, typically 2 MPa. The attracting force permits the chuck 3 to be deformed depending on the height of the vertically movable member 22.

The surface correcting means 4 is composed of a plurality (typically, 8 or 13 pieces) of the surface correcting portions 5 having the above configuration. An irregular state on the front surface of the wafer 2 can be corrected by independently driving a plurality of the surface correcting portions 5 by the unit driver 10.

Specifically, since the wafer 2 is vacuum-attracted to the chuck 3 by the effect of a sufficient attracting force, it is deformed along the deformed geometries of a plurality of the surface correcting portions of the surface adjusting means 4, whereby the surface state (irregularities) of the wafer 2 is corrected. In this case, since the chuck 3, vertically movable member 22 and the slide member 14 are each formed of the rigid body; the vertically movable member 22 is in direct-contact with the slide member 15 except for the case that the slide member 15 is moved; and the chuck 3 is strongly vacuum-attracted to the vertically movable member 22 by the pre-load shaft 23, the surface state of the wafer 2 is corrected with no elasticity. As a result, even if the front surface of the wafer 1 is applied with a force upon polishing, the elastically deformed amount of the front surface of the wafer 2 is extremely small. That is, the amount of elasto-plastic deformation of the corrected surface of the wafer 2 due to a force applied to the corrected surface upon polishing is extremely smaller than the corrected amount thereof.

This will be described in detail below. When the wafer 2 is simply subjected to coating of a resist film and to exposure, a force applied to the wafer 2 is small. In this case, even if the rigidity of the holding system on the lower side of the wafer 2 is low, there is no fear that the wafer 2 is deformed. Besides, when the wafer 2 is polished or the like, a relatively large polishing pressure is applied to the wafer 2. In this case, if the rigidity of the holding system on the lower side of the wafer 2 is low, there is a fear that the wafer 2 is deformed by elasto-plastic deformation of the holding system caused by the applied polishing pressure. The resultant deformation of the wafer 2 leads to an error in the surface state of the wafer 2 which has been corrected. For this reason, in the case where the wafer 2 is polished, the holding system on the lower side of the wafer 2 is required to have a sufficiently large rigidity. And, the holding system can be given such a large rigidity by the surface correcting portions 5 of the surface adjusting means 4 shown in FIGS. 4A, 4B.

Figure 5A:
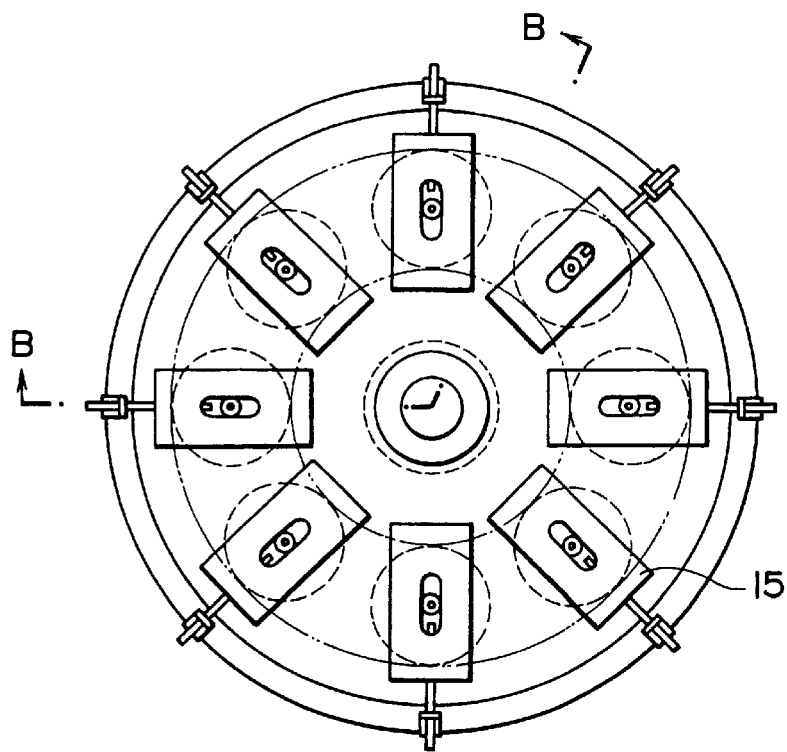
Figure 5B:
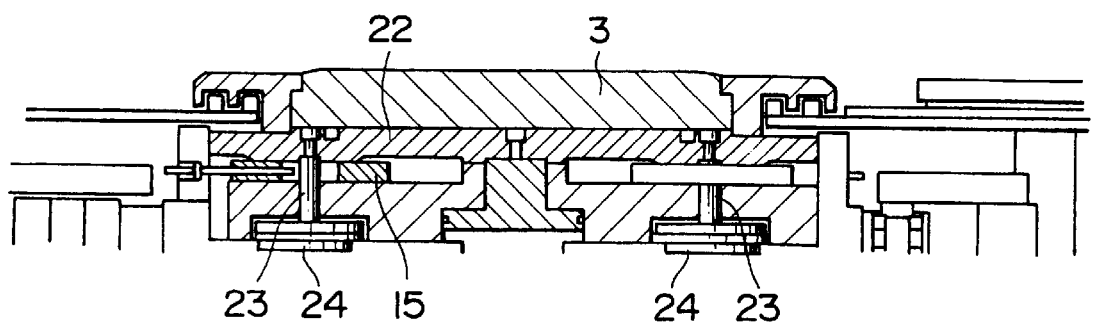

FIGS. 5A, 5B show a practical example of the surface adjusting means 4 shown in FIGS. 4A, 4B, wherein FIG. 4A is a plan view of the example, and FIG. 5B is a sectional view taken on line B—B of FIG. 5A. In these figures, reference numeral 3 indicates a chuck, and 22 is a vertically movable member. In this example, the chuck 3 is directly brought in contact with the upper surface of the vertically movable members 22. It is to be noted that in the principle illustrating example shown in FIGS. 4A, 4B, the chuck is brought in contact with the vertically movable member indirectly, that is, with the pre-load shaft 23 interposed therebetween. Reference numeral 15 indicates a slide member having the upper surface being in contact with the lower surface of the vertically movable member 22, and 23 is a pre-load shaft driven by an air cylinder 24 for attracting the chuck 3 downward.

Figure 6A:
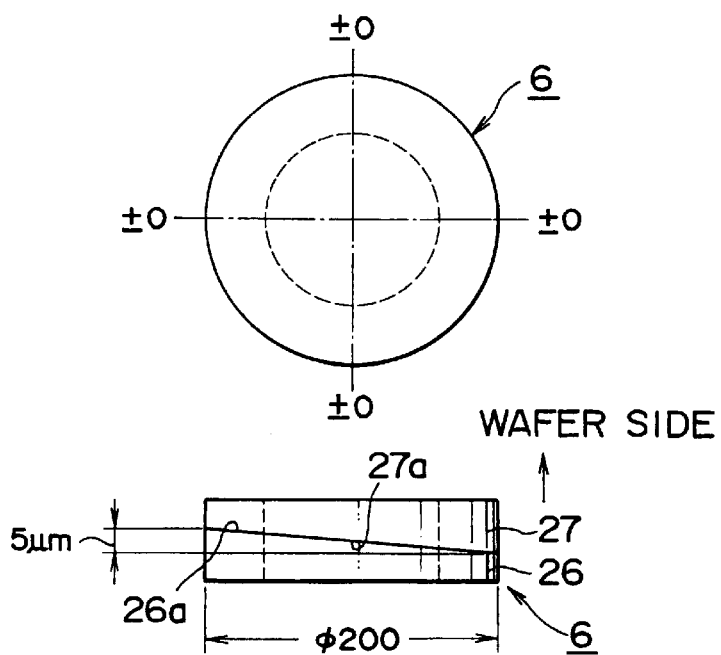
Figure 6B:
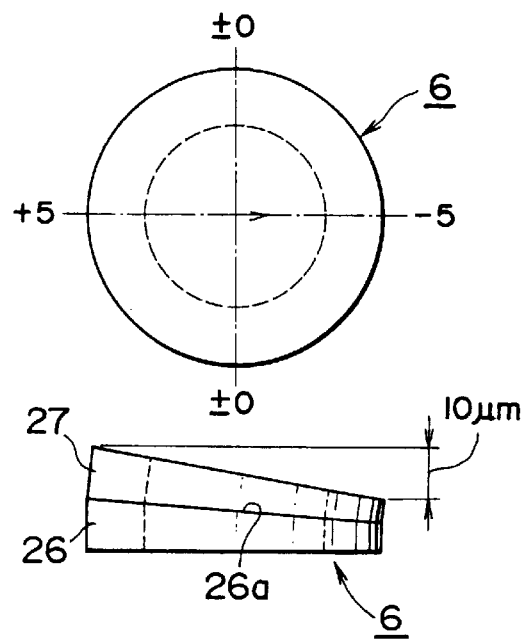
Figure 6C:
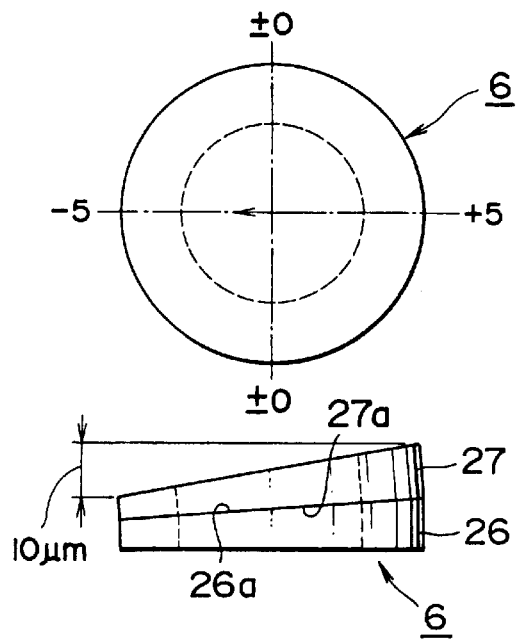

FIGS. 6A, 6B, 6C show an example of the tilting portion 6 as the orientation adjusting means, wherein FIG. 6A shows a state in which the tilting is zero; FIG. 6B, shows a state in which only a surface displacing member is 180° rotated; and FIG. 6C shows a state in which only a base member is 180° rotated. In each figure, the plan view and the cross-section of the tilting portion 6 are shown on the upper and lower half sides, respectively.

The tilting portion 6 is basically composed of a pair of members 26, 27 which are vertically two-divided parts typically formed by cutting a columnar (or cylindrical) rigid body of 200 mm in diameter along a plane tiltingly crossing the center axis of the rigid body. The lower member 26 is a base member having an upper tilting surface 26a. The upper member 27 is a surface displacing member 27 having a lower tilting surface 27a. The upper surface of the surface displacing member 27 functions as an orientation displacing surface which is changed in the orientation of the surface tilting with respect to the center axis and the tilting angle thereof in accordance with both rotation of the surface displacing member 27 itself and rotation of the base member 26. The above-described surface adjusting member 4 is placed on the orientation displacing surface of the surface displacing member 27. The base member 26 is positioned on a base surface (not shown). In addition, a broken line in each figure shows a virtual position separated a specific distance from the center for an easy understanding of the action (change in orientation) of the tilting portion 6.

A height difference between the maximum height position and the minimum height position of each of the tilting surfaces 26a, 27a is typically 5 µm. In the basic state shown in FIG. 6A, the maximum height positions of the tilting surfaces 26a, 27a face to each other and the minimum height positions thereof face to each other. In this case, the upper surface (orientation displacing surface) of the surface displacing member 27 is in a state being not tilted. When the base member 26a and the surface displacing member 27a are relatively rotated from the above basic state, the upper surface (orientation displacing surface) of the surface displacing member 27 is tiled such that the axial tilting thereof is within a range of −5 to +5 µm per 100 mm in radius. When a specific axial tilting within the above range is required on the basis of the calculated result, the base member 26a and the surface displacing member 27a may be relatively rotated to an extent corresponding to the specific axial tilting. FIG. 6B shows the state in which only the surface displacing member 27 is 180° rotated from the state shown in FIG. 6A, and FIG. 6C shows the state in which only the base member 26 is 180° rotated from the state shown in FIG. 6A. In each state, the tilting of 5 µm (absolute value) per 100 mm in radius is created.

The orientation of the tilting of the upper surface (orientation displacing surface) of the surface displacing member 27 can be changed in a range of 0° to 360° by integrally rotating the base member 26 and the surface displacing member 27 while keeping the relative angular therebetween. In addition, the base member 26 and the surface displacing member 27 may be each provided at its periphery with gear teeth in order to be rotated through the gear teeth, or they may be provided at the peripheries thereof with a rack and a pinion in order to be rotated through the rack and pinion.

In summary, the tilting portion 6 can change the surface tilting angle of the surface displacing member 27 with respect to the center axis within a specific angular range, and it also can change the orientation of the surface tilting within a range of less than 360°.

After adjustment of the tilting angle and the orientation of the tilting, the base member 26 and the surface displacing member 27 are pressingly fixed using a lock cylinder, and the orientation thereof with respect to the base surface (not shown) is corrected. Accordingly, since only a rigid body is interposed (that is, no elastic body is interposed) between the upper surface, that is, the surface displacing surface of the surface displacing member 27 and the base side surface for supporting the base member 26, the wafer 2 can be usually held in a state being supported by the rigid bodies. As a result, it is possible to eliminate the fear that the front surface of the wafer is sunk by a pressing force upon polishing or the like.

Figure 7:
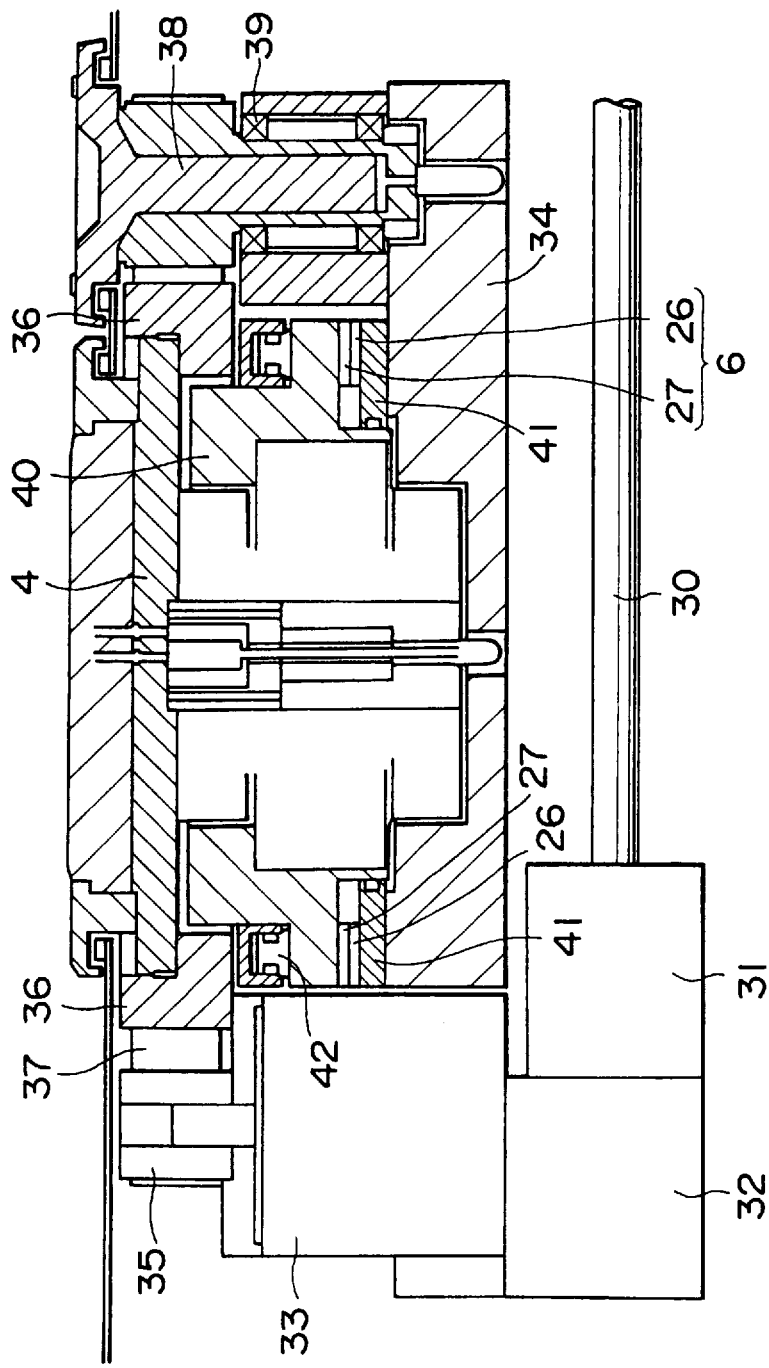
FIG. 7 is a sectional view showing an example in which the tilting portion is assembled in a polishing machine.

FIG. 7 is a sectional view showing an example in which the above tilting portion 6 is assembled in a polishing apparatus. In this figure, reference numeral 30 indicates a rotating screw, which extends, for example, in the X-direction; 31 is a nut to be screwed with the rotating screw 30; and 32 is a movable body integrated with the nut 31, which is moved by rotation of the rotating screw 30. A servo-motor 33 and a slide table 34 are supported on the movable body 32, and the essential portions of the polishing apparatus can be entirely moved by movement of the movable body 32. Reference numeral 35 indicates a pulley fixed on a rotating shaft of the servo-motor 33; 4 is a surface adjusting means (which is simply shown by upward, rightward hatching lines for an easy understanding); 36 is a pulley mounted around the outer peripheral surface of the surface adjusting member 4; 37 is a flat belt for transmitting a rotating force from the pulley 35 to the pulley 36; and 38 is an idler for keeping a tension of the flat belt 37 to be more than a specific value. The flat belt 37 is suspended around the pulleys 35, 36 and the idler 38.

Reference numeral 39 indicates a deep groove ball bearing; 40 is a bearing housing; 41 is an air bearing unit. The portion shown by the hatching lines, such as the surface adjusting means 4 is rotated in the air bearing unit 41. Reference numeral 26 indicates a cylindrical base member of the tilting portion 6, and 27 is a cylindrical surface displacing member thereof. The base member 26 is placed on a base 41 integrated with the slide table 34. Reference numeral 42 indicates a lock cylinder for pressing the base member 26 and the surface displacing member 27 after adjustment of the surface tilting angle and the orientation of the tilting.

Figure 8:
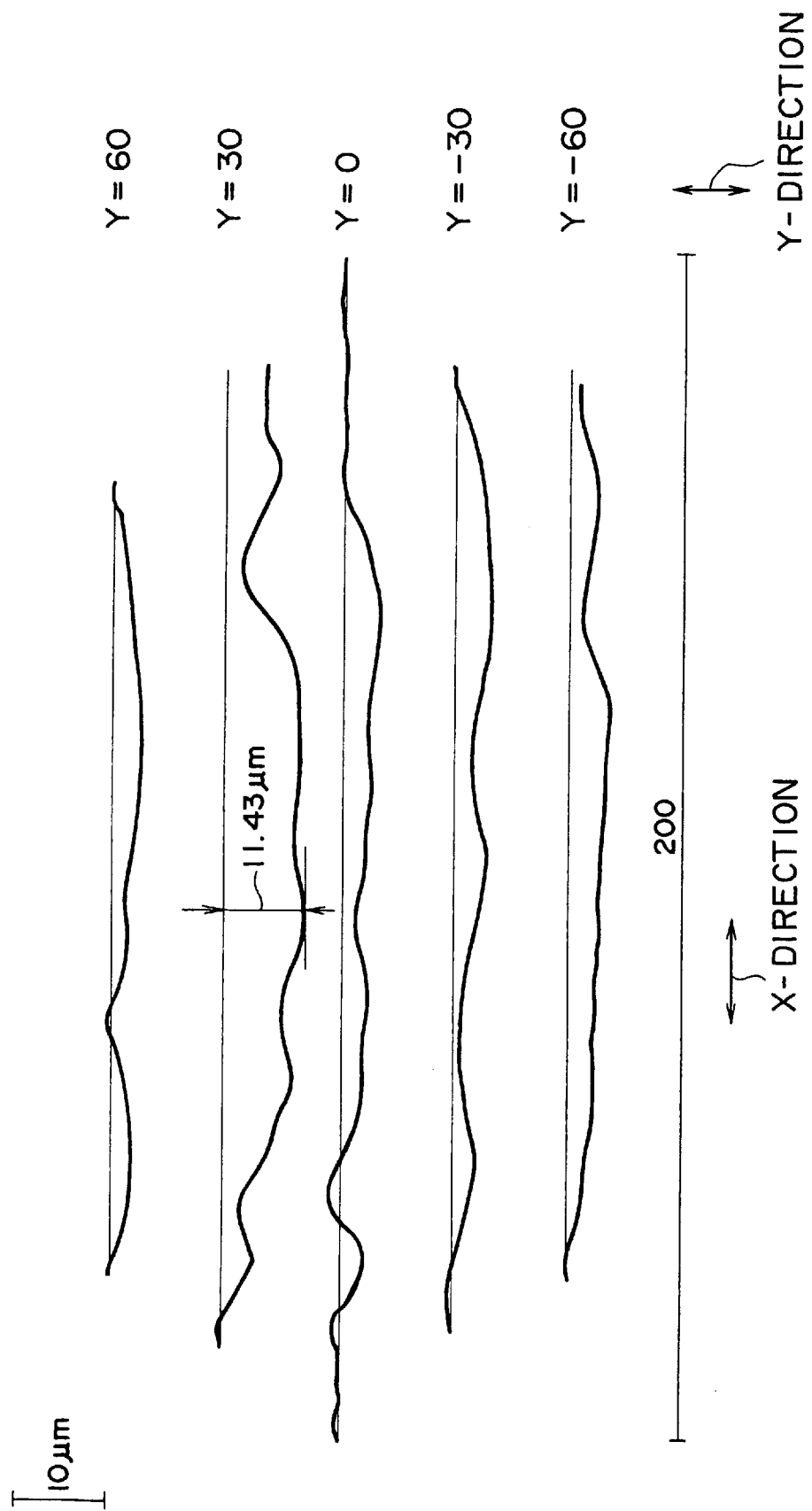
FIG. 8 is a diagram showing a state of a front surface of a semiconductor wafer before correction.
Figure 9:
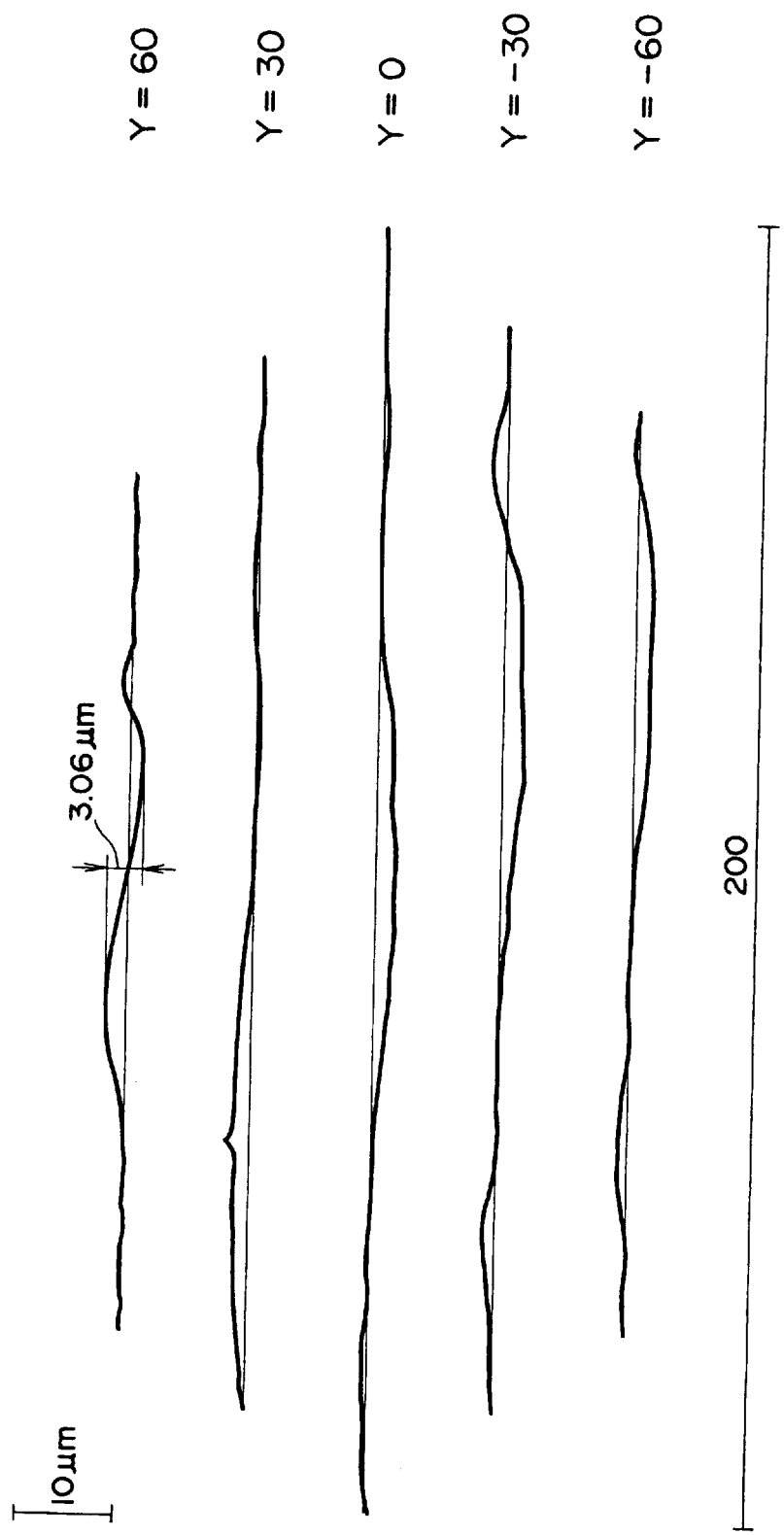
FIG. 9 is a diagram showing a state of the front surface of the wafer shown in FIG. 8 after the first correction by the apparatus of the present invention.
Figure 10:
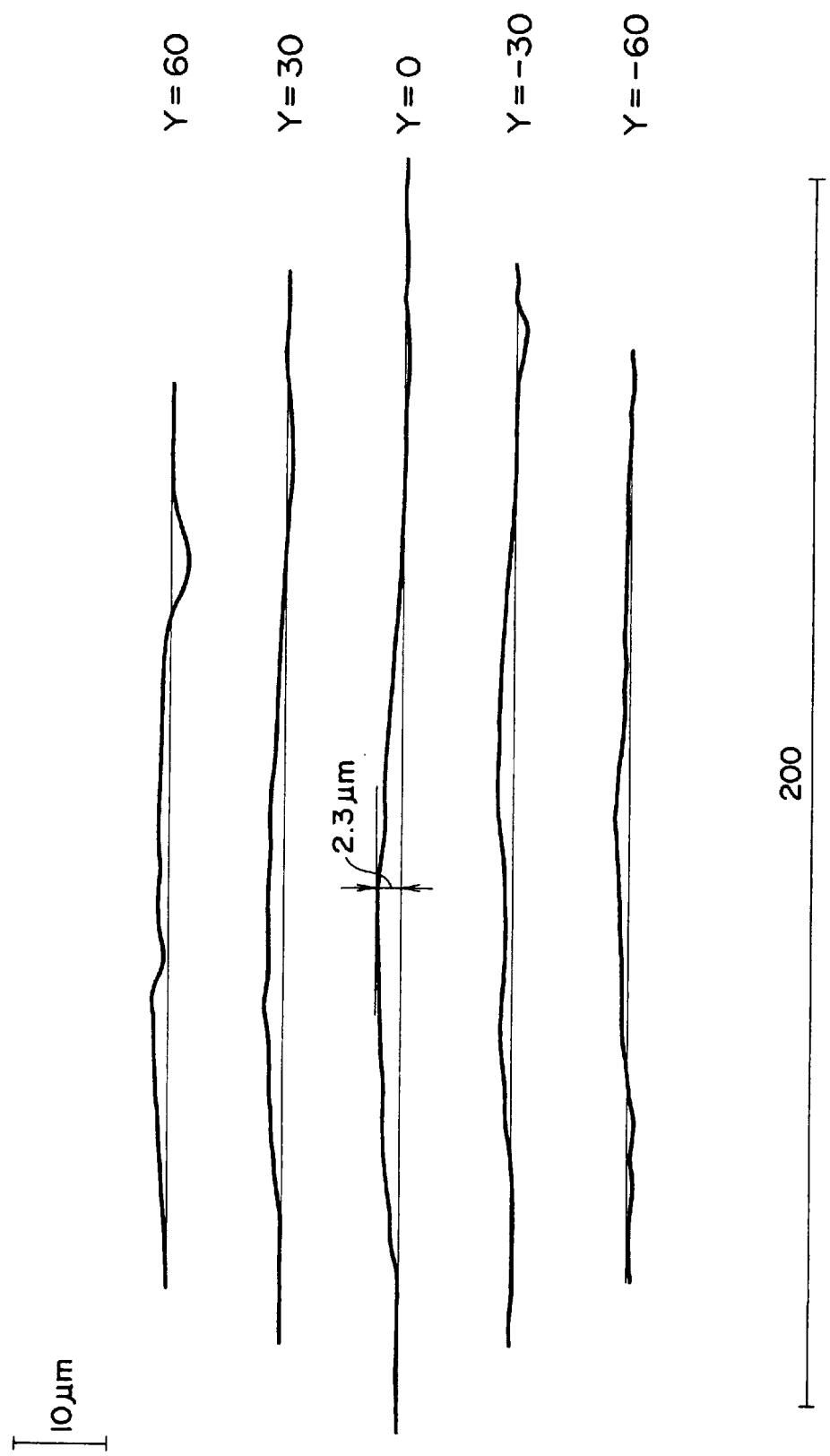
FIG. 10 is a diagram showing a state of the front surface of the wafer shown in FIG. 9 after the second correction by the apparatus of the present invention.

FIGS. 8, 9 and 10 show examples in which an irregular state on the front surface of a semiconductor wafer is sequentially flattened by the apparatus of the present invention. In these examples, there are shown changes in height deviation δ on five lines (of Y=60 mm, 30 mm, 0 mm, −30 mm and −60 mm) parallel to the orientation flat of a 8-inch semiconductor wafer. FIG. 8 shows a state before correction; FIG. 9 shows a state after one correction; and FIG. 10 shows a state after one more (that is, double) correction.

As is apparent from FIGS. 8 to 10, the maximum height deviation δmax of the wafer before correction is 11.43 µm, which is reduced to 3.06 µm after the first correction, and is further reduced to 2.30 µm after the second correction. This clearly shows that the apparatus of the present invention is significantly effective for correction of the surface geometry of the wafer.

FIGS. 11A, 11B are diagrams each comparatively showing pictures transcribed from images which are obtained by measuring surface states of a 8-inch semiconductor wafer before and after correction using a laser interferometer as a measuring device, wherein FIG. 11A shows the pictures transcribed from the images in the field of 60 mm in diameter at a point of Y=50 mm, and FIG. 11B shows the pictures transcribed from the images in the field of 60 mm in diameter at the wafer center. In each figure, the pictures before and after correction are shown on the upper and lower half sides, respectively. In these figures, streaks are equivalent to contour lines each having a width of about 0.3 µm. From these figures, it is revealed that the surface geometry of the wafer can be flattened by correction performed in accordance with the present invention.

Figure 12A:
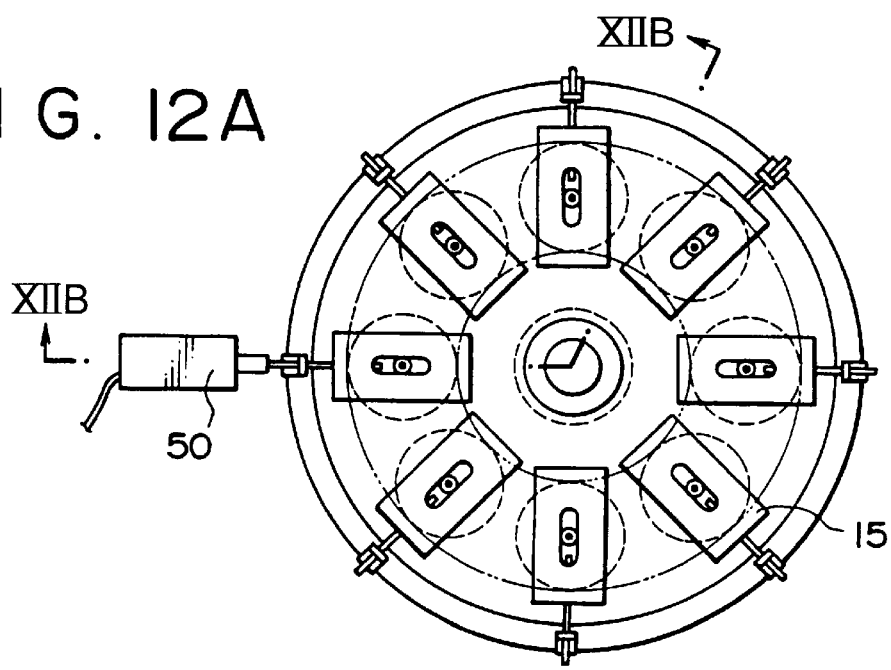
Figure 12B:
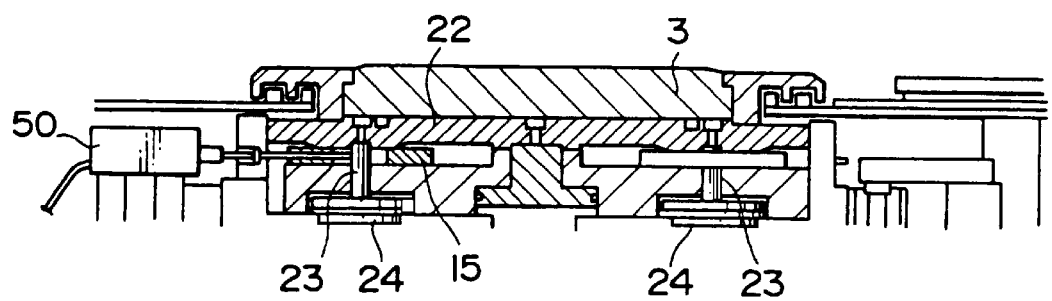
Figure 12C:
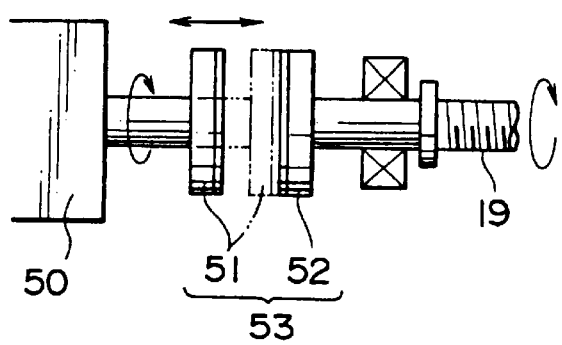

Next, a modification of the above-described embodiment will be described with reference to FIGS. 12A, 12B, 12C. FIG. 12A is a plan view of a surface adjusting means in accordance with the modification; FIG. 12B is a sectional view taken on line B—B; and FIG. 12C is a view illustrating a power transmission means for transmitting a power from a power source to a slide member. The surface adjusting means of this modification uses a pulse motor 50 as the power source for driving surface correcting portions of the surface adjusting means. The pulse motor 50 may be provided for each surface correcting portion; however, as shown in FIG. 12C, the motor 50 may be provided for driving all of the surface correcting portions. In the latter case, a clutch means 53 composed of a motor side member 51 and a screw side member 52 is provided between the motor 50 and a screw (positioning bolt 19, see FIGS. 4A, 4B) for removably mounting the motor 50 to the slide member 15, whereby the surface correcting portions 5 are adjusted one after another while the entire chuck 3 is rotated a specific angle by the motor 50.

In each of the surface adjusting means shown in FIGS. 5A, 5B and FIGS. 12A to 12C, the provision of the drive source 50 for driving the surface correcting portions 5 outside the surface correcting portions 5 has the following various advantages.

First, the above arrangement of the drive source 50 prevents occurrence of the phenomenon that heat generated from the motor 50 as the power source is transmitted to the slide member 15 and also to the vertically movably member 22 so that the adjusted surface state is deviated by thermal deformation of the slide member 15 and the vertically movably member 22.

In the semiconductor fabrication technique requiring correction in the order of sub-micron, the surface height of each the slide member 15 and the vertically movable member 22 is changed to such an extent as not to be negligible even if the temperature of the member is changed only 1° C., although such a change in thickness is strictly dependent on the total thickness of the member. For this reason, the transmission of heat from the power source to the slide member and the vertically movable member is not negligible.

This will be described in detail below. In the case where each of the slide member 15, vertically movable member 22, and chuck 3 is made from stainless steel (SUS304) having a thermal expansion coefficient of $14.7 \times 10^6$ α/K and has a thickness of about 20 mm (30 mm for the example shown in FIGS. 4A, 4B and FIGS. 5A, 5B), the thermal deformed amount thereof is 0.29 µm per 1° C. For the member (thickness: 20 mm) made from aluminum having a thermal expansion coefficient of $23 \times 10^{-6}$ α/K, the thermal deformed amount is 0.46 µm per 1° C. Even for the member (thickness: 20 mm) made from ceramic such as 94% $Al_2O_3$ having a thermal expansion coefficient of $7.1 \times 10^{-6}$ α/K, the thermal deformed amount is 0.14 µm per 1° C. As a result, when the temperature of the member is changed several °C., the surface height of the member is changed several times the above deformed amount per 1° C., so that an error in surface correction depending on temperature is no longer negligible. Thus, it is required to suppress a temperature change of the member as much as possible, and to prevent heat generated at the power source for driving the surface correcting portions from being transmitted to the member.

From this viewpoint, according to the surface adjusting means of the present invention, since the motor 50 as the power source is provided separately from the slide member 15, it is possible to suppress transmission of heat generated at the motor 50 to the slide member 15 and hence to reduce a deviation in the adjusted surface state due to the temperature change of the slide member 15.

The surface adjusting means of the present invention has another advantage. Since the screw (bolt 19) screwed with the thread hole formed in the slide member 15 is connected to the rotating shaft of the motor 50 through the clutch means 53 and the surface correcting portion 5 is driven by movement of the slide member 15 by means of the motor 50, a wiring required for driving the motor 50 can be provided independently from the rotating portion (chuck 3) of the apparatus, with a result it is possible to eliminate the fear that the rotation of the rotating portion is obstructed by the wiring.

A further advantage is that the adjusted surface state can be kept even after the surface adjusting portion is removed from the apparatus. In other words, the surface adjusting portion can be removably mounted as a single jig.

An important feature of the surface adjusting means of the apparatus according to the present invention will be described below. A plurality of the surface correcting portions 5 of the surface adjusting means can be adjusted in accordance with various manners. For example, they can be adjusted one after another because the adjusted state of one surface correcting portion 5 is not changed even at the time when the next one is adjusted. Of course, all of the surface correcting portions 5 may be collectively adjusted at one time.

To realize such adjustment of the surface correcting portions 5 one after another without occurrence of any change in the previously adjusted surface state, a tilting angle and a friction coefficient of each of the mutually slidably moved tilting surfaces 15a, 22a of the slide member 15 and the vertically movable member 22 must be set at respective values allowing the slide member 15 not to be slid by the effect of the dead weight of the vertically movable member 22 and an allowable load applied from top. If not so, when the chuck 3 and the vertically movable member 22 are applied with a downward load, the slide member 15 is slid, with a result that the vertically movable member 22 is moved downward.

When the tilting surfaces 15a, 22a satisfy the above requirement, although the vertically movable member 22 is vertically moved by sliding movement of the slide member 15, there is no fear that the slide member 15 is moved by the effect of a load applied to the vertically movable member 22 and thereby the vertically movable member 22 is vertically moved. As a result, there is no fear that the adjusted state is deviated after the adjustment is once completed.

This means that the adjusted surface state can be kept unless an additional force is continuously applied to the surface adjusting means for forcibly keeping the adjusted surface state. That is, it is not necessary to provide any special means for forcibly keeping the adjusted surface state. In summary, the surface state having been adjusted once can be easily stably kept even when the vertically movable member is applied with a load. For example, in the case where a piezoelectric element is used as a power source for surface correction, a current used for adjustment must be continuously applied for keeping the adjusted surface state; however, according to the surface adjusting means of the present invention, the adjusted surface state can be kept even when the motor 50 is separated from the surface correcting portions 5.

In addition, the surface adjusting means can be modified such that the motor 50 is provided for each surface correcting portion 5 and a current is applied to each motor 50 through a removably mounted socket, whereby the surface adjustment is sequentially performed by a method wherein after one surface correcting portion 5 is adjusted by applying a current to one motor 50, the current is applied to the next motor 50 through the socket.

Figure 13A:
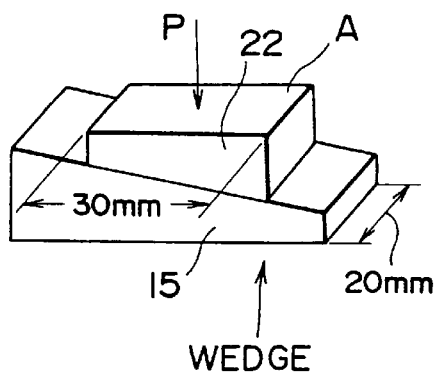
Figure 13B:
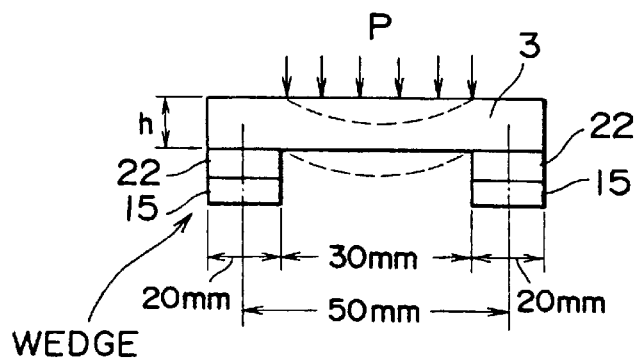

A concrete design example of the surface correcting portion 5 will be described below, particularly, in the viewpoint of an allowable load with reference to FIGS. 13A, 13B. FIG. 13A is a typical perspective view of a slide member 15 and a vertically movable member 22, and FIG. 13B is a sectional view of the slide member 15, the vertically movable member 22, and a chuck 3. Assuming that each of the members 15, 22 is made from an iron based material, a force E per unit area applied to the vertically movable member 22 is generally estimated at $2 \times 10^5$ [N/mm²]. An area A of the upper surface of the vertically movable member 22 is set at 600 mm² [30 mm (width)×20 mm (length)], and a height 1 is set at 20 mm. Further, a deformed amount of the surface height of the vertically movable member 22 ia taken as $\lambda$. In addition, for an easy understanding, the slide member 15 and the vertically movable member 22 are collectively called a "wedge".

In this case, the vertical rigidity Ks of the wedge is expressed by the following equation (1). It is noted that the deformed amount of the surface height of the wedge is taken as $\lambda$.

$$Ks = EA/1 = 6000 \ [N/\mu m] \quad (1)$$

Next, assuming that the arrangement pitch of the wedges is taken as 50 mm as shown in FIG. 13B, a displacement $\delta$max of the wedge applied with a surface pressure of P [N] is calculated. First, it is assumed that a surface pressure $\omega$ per unit length L of the chuck 3 is taken as P/L; bh³/12 is taken as I, that is, I=bh³/12 where b is the depth width (=30 mm) of the vertically movable member 22 and h is the thickness of the chuck (table) 3.

The displacement $\delta$max is thus given by the following equation:

$$\delta max = 5 \ \omega L^4/3EI = 4.05 \times 10^7 \ P/h^3 \quad (2)$$

From the equation (2), a surface rigidity Kt of the chuck (table) 3 is given by $$Kt = PbL/\delta max = h^3/4.05 \times 10^7 \quad (3)$$

Here, to realize a resolution of 0.1 $\mu$m, that is, to enable the positional adjustment in the order of sub-micron, a vertical displacement of the wedge is required to be 0.01 $\mu$m or less. And, the load P allowing the displacement to be 0.01 $\mu$m or less is expressed by the following equation (4) on the basis of the relationship of Ks/0.01=PA.

$$P = 1 \ [GPa] \quad (4)$$

The magnitude (1 GPa) of the load P is, in fact, extremely large as an allowable load. Next, by substituting P=1 GPa or less, and $\delta$max=0.1 $\mu$m or less into the above equation (3), the height h is determined at a value of 4.48 mm or more. These values of P, $\delta$max, and h can be sufficiently set in the actual design.

The above design example is summarized as follows: the arrangement pitch of the wedge is 50 mm; the thickness of the chuck (table) 3 is 4.5 mm; the setting resolution is 0.1 $\mu$m ; and the allowable load is 1 GPa.

Figure 14:
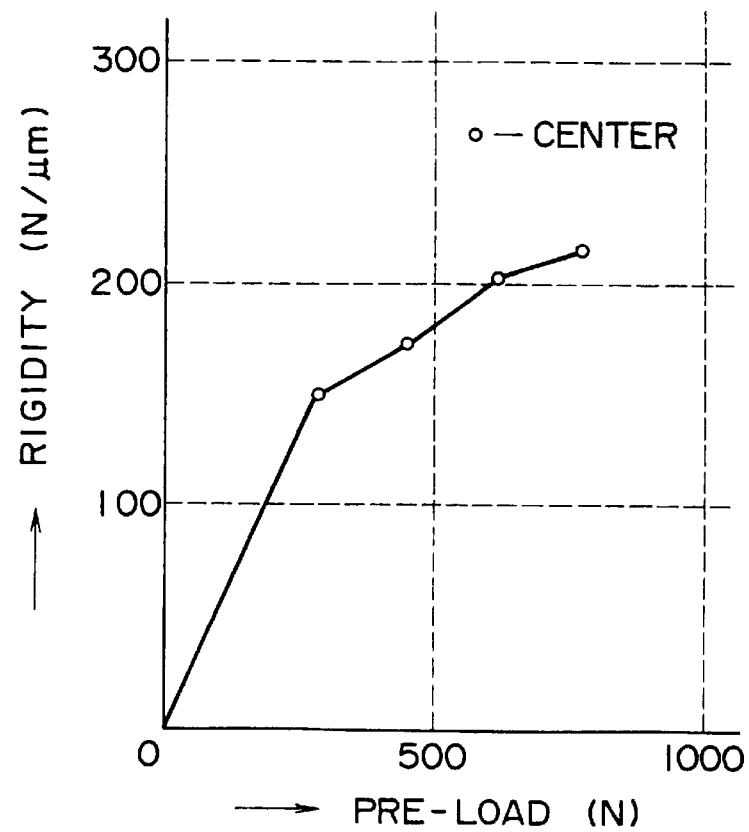
FIG. 14 is a diagram showing a relationship between a pre-load of the chuck and a rigidity thereof.
Figure 15:
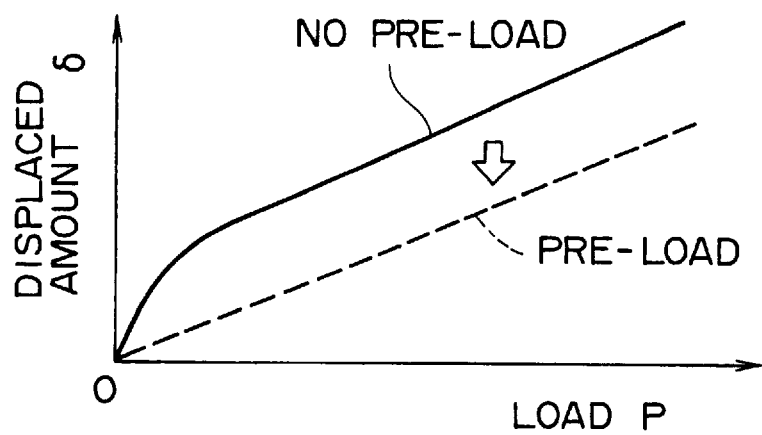
FIG. 15 is a diagram showing relationships between a load applied to the chuck and the deformed amounts of the chuck for the case with a pre-load and the case with no pre-load.

To make smaller apparently the displacement of the chuck 3 against a load, it is effective to apply a pre-load to the chuck 3. This will be described with reference to FIG. 14. In this figure, the abscissa indicates a magnitude (N) of a pre-load applied to the chuck 3 for displacing the chuck 3 downward by, for example, a pre-load shaft 23 and an air cylinder 24; and the ordinate indicates a rigidity (N/$\mu$m) of the chuck 3. Since the rigidity of the chuck 3 is made apparently larger than that inherent to the chuck 3 by applying such a pre-load, the allowable load P is made larger, and also the displacement of the surface height of the chuck 3 is made smaller against the same load. FIG. 15 shows relationships of the displacements $\delta$ against the load P for both the case applied with a pre-load and the case applied with no pre-load.

Figure 16:
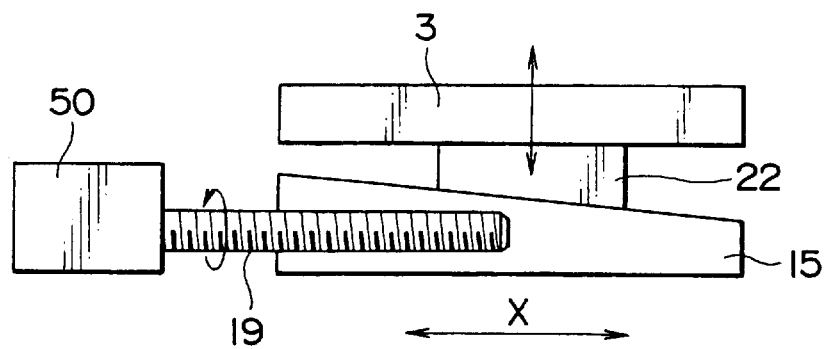
FIG. 16 is a view illustrating a concrete example of resolution in displacement.

The resolution in displacement will be concretely described with reference to FIG. 16. In the example shown in FIG. 16, as the motor 50, there is used a pulse motor having a characteristic of achieving 360° turn per 1000 pulses (0.36° per one pulse). Here, it is assumed that a pitch of a screw 19 is 0.35 mm; a movement stroke (in the X-direction) of a slide member 15 is ±10 mm; and a vertical stroke (in the Z-direction) of a vertically movable member 22 is ±10 $\mu$m=0.01 mm. On such an assumption, a moved amount $\Delta X$ of the slide member 15 per one pulse of the pulse motor 50 becomes 0.00035 mm (0.35/1000 [mm]). On the basis of a relationship of $\Delta X/\Delta Z = 10/0.01$, a vertically moved amount $\Delta Z$ per one pulse of the vertically movable member 22 becomes $0.00035 \times 10^{-3}$ mm, that is, 0.00035 $\mu$m.

In this way, the resolution $\Delta Z$ in displacement can be set at 0.00035 $\mu$m. When the wedge (slide member 15 and the chuck 3) is applied with an allowable load P of 1 GPa as described above, the displacement of the slide member 15 becomes 0.01 $\mu$m on the basis of the above equation (4), and the displacement of the chuck 3 becomes 0.1 $\mu$m on the basis of the above equation (5). Accordingly, assuming that the load of 1 GPa which is ten times a value estimated to be actually applied, 100 MPa is applied to the wedge, the displacement of the chuck 3 is 0.1 $\mu$m; the displacement of the slide member 15 is 0.01 $\mu$m (one-tenth of the displacement of the chuck 3); and the resolution in displacement is 0.00035 $\mu$m (less than one-tenth of the displacement of the slide member 15). Thus, the displacement of 0.1 $\mu$m can be realized against the allowable load with a sufficient design safety.

Figure 17A:
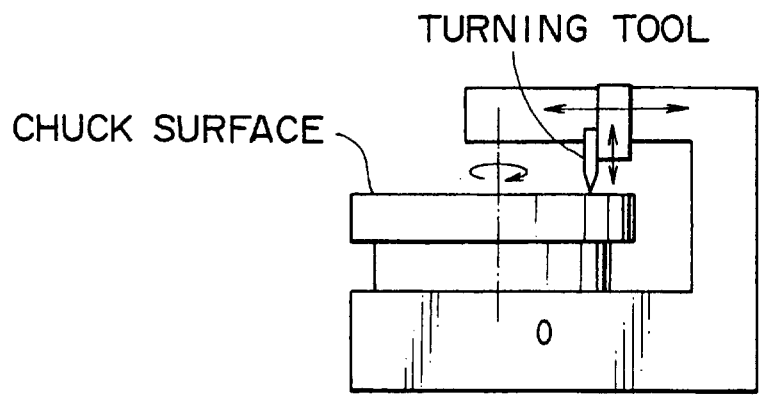
FIGS. 17A, 17B, 17C are schematic views each showing an example in which flatness of the surface of the chuck is adjusted.
Figure 17B:
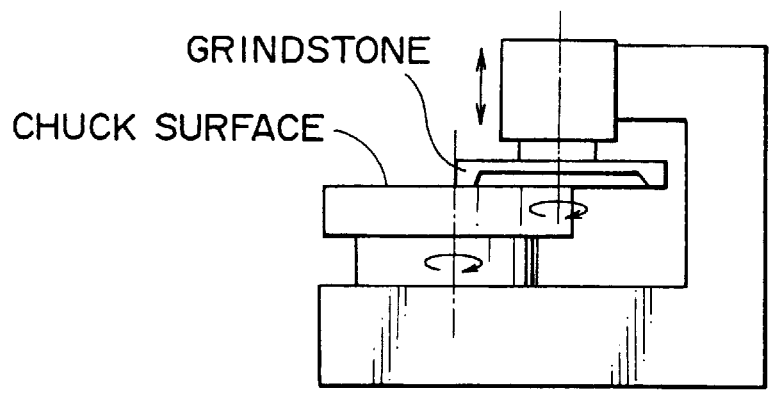
Figure 17C:
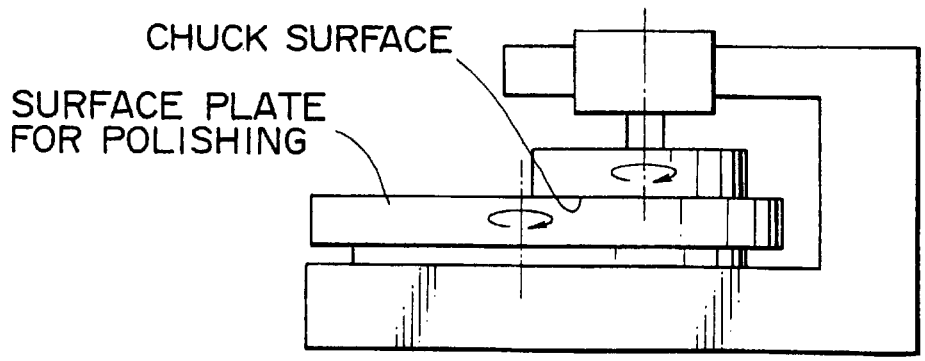
Figure 18A:
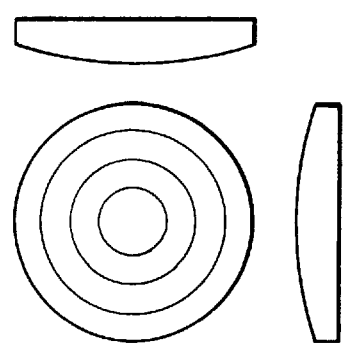
FIGS. 18A to 18D are views each showing an example of a surface geometry of a semiconductor wafer.
Figure 18B:
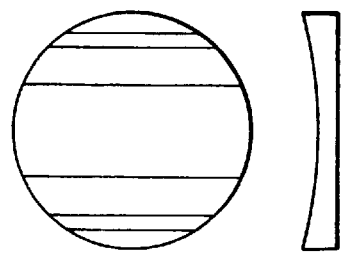
Figure 18C:
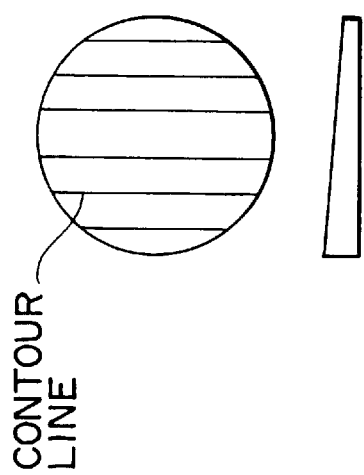
Figure 18D:
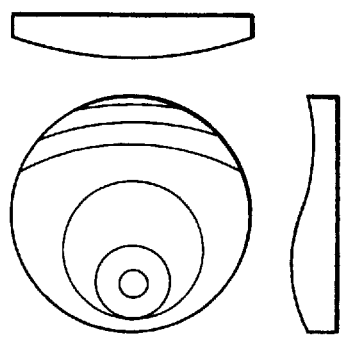

As described above, since the rigidity of the chuck 3 can be made higher, errors in surface flatness and surface orientation of the chuck 3 due to an assembling error caused during assembling the apparatus of the present invention and an accuracy error of each part can be corrected by machining (self-grinding) after assembly. FIGS. 17A, 17B, 17C are schematic views illustrating states in which the surface of the chuck 3 is machined, wherein FIG. 17A shows an example in which the surface of the chuck 3 is cut with a turning tool; FIG. 17B shows an example in which it is ground with a grindstone; and FIG. 17C shows an example in which it is polished with a surface plate for polishing. In each example, the apparatus of the present invention is integrally assembled in the turning machine, grinding machine or polishing machine, and the surface of the chuck 3 is machined into a surface high in flatness and also high in perpendicularity to the center axis of the machine.

The above correction of the flatness of the chuck 3 is significantly effective because the dimensional accuracy of the apparatus of the present invention cannot be actually increased to the order of sub-micron. Concretely, there is a limitation in desirably increasing the accuracy of each part and the assembling accuracy when the apparatus is assembled, and accordingly, the flatness of the chuck 3 is required to be corrected after the assembly by any one of the above machining processes. In this case, if the rigidity of the chuck 3 is low, the surface of the chuck 3 is deformed by a load applied thereto for correcting the flatness thereof and thereby it cannot be sufficiently corrected.

According to the above-described design example, however, since the allowable load (1 GPa) is quite larger than a machining load actually applied to the chuck 3, the flatness of the surface of the chuck 3 can be corrected in accordance with, for example, each of the processes shown in FIGS. 17A, 17B, 17C.

The apparatus of the present invention is suitable not only for a polishing machine, a resist film coating apparatus, or an exposure system but also for various applications in which a sheet such as a semiconductor wafer must be held in a state that the front surface thereof is desirably corrected. Specific examples of the sheets may include a silicon semiconductor wafer, a compound semiconductor wafer, a SOI wafer, and a substrate for a liquid crystal display; however, these are illustrative purposes only, and it is to be understood that the present invention can be applied to any sheet insofar as it is required to be held in a state that the front surface thereof is corrected. Additionally, the surface measuring means may be of any type insofar as it can measure the geometry of the front surface of a sheet held on the above holding portion.

What is claimed is:

1. An apparatus for correcting and holding a state of a front surface of a sheet, comprising:

a holding portion for holding a sheet;

a surface measuring means for measuring a state of a front surface of said sheet held on said holding portion;

a surface adjusting means positioned on the underside of said holding portion, said means comprising a plurality of surface correcting portions vertically movable for partially deforming said holding portion, whereby the geometry of the front surface of said sheet disposed on the surface of said holding portion is adjusted by deforming the surface of said holding portion and said sheet held on the surface of said holding portion through independent actions of said surface correcting portions; and an orientation adjusting means, positioned on the underside of said surface adjusting means, for adjusting a tilting of the front surface of said sheet with respect to the center axis thereof;

wherein a state of the front surface of said sheet is corrected by measuring the tilting of the front surface of said sheet with respect to the center axis thereof and the geometry of the front surface of said sheet using said surface measuring means, and controlling both said orientation adjusting means and said surface adjusting means on the basis of the measured results.

2. An apparatus according to claim 1, wherein each of said plurality of surface correcting portions of said surface adjusting means comprises:

a slide member formed of a rigid body which is reciprocatingly movable in one direction and which has a tilting surface tilting in said direction; and a vertically movable member formed of a rigid body which is movable, by movement of said slide member, in the direction perpendicular to the movement direction of said slide member and which has a tilting surface slidable on said tilting surface of said slide member;

whereby the geometry of the front surface of said sheet is corrected by deforming the surface of said holding portion and said sheet held on the surface of said holding portion through vertical movement of said vertically movable members of said plurality of surface correcting portions.

3. An apparatus according to claim 2, wherein a tilting angle and a friction coefficient of each of said mutually slidable tilting surfaces of said slide member and said vertically movable member are specified at respective values allowing said slide member not to be slid by both the dead weight of said vertically movable member and an allowable load applied from top.

4. An apparatus according to claim 2, wherein a power source for reciprocatingly moving said slide member is provided separately from said slide member.

5. An apparatus according to claim 4, wherein said power source comprises a motor;

a thread hole is formed in said slide member; and a screw to be screwed with said thread hole is connected to a rotating shaft of said motor.

6. An apparatus according to claim 1, wherein said orientation adjusting means comprises:

a base member and a surface displacing member, which are two-divided parts formed by cutting an intermediate portion of a columnar or cylindrical rigid body along a plane tilting with respect to the center axis of said rigid body, said base member and said surface displacing member being slidably rotatably held in such a manner that the center axes thereof are not offset from each other on the cutting plane;

wherein an orientation of an opposed surface of said surface displacing member to said cutting surface thereof is changed by rotating either or both of said base member and said surface displacing member.

* * * * *